(12) United States Patent
Kim et al.

(10) Patent No.: US 12,745,524 B2
(45) Date of Patent: Sep. 22, 2026

(54) DISPLAY DEVICE AND MOBILE ELECTRONIC DEVICE INCLUDING THE SAME

(71) Applicant: Samsung Display Co., Ltd., Yongin-Si (KR)

(72) Inventors: Kyung Bae Kim, Yongin-si (KR); Jin Seon Kwak, Yongin-si (KR); Yong Hee Lee, Yongin-si (KR); Ji Hye Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 364 days.

(21) Appl. No.: 18/441,742

(22) Filed: Feb. 14, 2024

(65) Prior Publication Data

US 2025/0031535 A1 Jan. 23, 2025

(30) Foreign Application Priority Data

Jul. 17, 2023 (KR) ........................ 10-2023-0092548

(51) Int. Cl.
*H10K 59/131* (2023.01)
*H10K 59/122* (2023.01)
*H10K 59/80* (2023.01)

(52) U.S. Cl.
CPC ......... *H10K 59/131* (2023.02); *H10K 59/122* (2023.02); *H10K 59/8794* (2023.02)

(58) Field of Classification Search
CPC . H10K 59/131; H10K 59/8794; H10K 59/122
See application file for complete search history.

(56) References Cited

U.S. PATENT DOCUMENTS

| | | | | |
|---|---|---|---|---|
| 10,784,320 | B2 | 9/2020 | Park et al. | |
| 2019/0206946 | A1 | 7/2019 | Xu et al. | |
| 2024/0260436 | A1* | 8/2024 | Kim | H10K 59/122 |
| 2025/0024712 | A1* | 1/2025 | Pyo | G09G 3/3233 |
| 2025/0048907 | A1* | 2/2025 | Han | H10K 59/122 |

FOREIGN PATENT DOCUMENTS

KR 10-2018-0079037 A 7/2018

* cited by examiner

*Primary Examiner* — Yu Chen
(74) *Attorney, Agent, or Firm* — Innovation Counsel LLP

(57) ABSTRACT

A display device includes a driving element layer on a substrate, a wiring layer on the driving element layer and including a power supply wiring, and a light emitting element layer disposed on the wiring layer. The light emitting element layer includes a pixel defining layer defining openings for pixels, a first electrode in each opening, a heating wiring on the pixel defining layer around each opening, a connection electrode connecting the heating wiring and the power supply wiring through a contact hole extending through the wiring layer and the pixel defining layer, an intermediate layer covering the first electrode in the pixels and the pixel defining layer between the pixels, and including a disconnected portion on the pixel defining layer adjacent to the heating wiring, and a second electrode continuously disposed on the intermediate layer in the openings for the pixels and between the pixels.

20 Claims, 23 Drawing Sheets

FIG. 1

10
130
DA
NDA
MA
110
SBA
120
DR3
DR2
DR1

PC : T1, T2, T3, T4, C1
GL : GWL, GIL

DISPLAY DEVICE AND MOBILE ELECTRONIC DEVICE INCLUDING THE SAME

CROSS-REFERENCE TO RELATED APPLICATION

This application claims the benefit of Korean Patent Application No. 10-2023-0092548 filed on Jul. 17, 2023 in the Korean Intellectual Property Office, the disclosure of which is incorporated herein in its entirety by reference.

BACKGROUND

1. Field

The present disclosure relates to a display device and a mobile electronic device including the same.

2. Description of the Related Art

A wearable device that creates a focal point a short distance in front of a user's eyes is being developed in the form of glasses or a helmet. For example, the wearable device may be a head mounted display (HMD) or augmented reality (AR) glasses. Such a wearable device provides an AR screen or a virtual reality (VR) screen to a user.

A wearable device such as an HMD or AR glasses is required to have a display specification of at least 2000 pixels per inch (PPI) so that a user can use it for a long time without feeling dizzy. To this end, organic light emitting diode on silicon (OLEDoS) technology, which is a small high-resolution organic light emitting display device, is being proposed. OLEDoS is a technology for placing an organic light emitting diode (OLED) on a semiconductor wafer substrate on which a complementary metal oxide semiconductor (CMOS) is disposed.

Since the distance between pixels is reduced in a display panel to which the OLEDoS technology is applied, an unintended leakage current may be generated between adjacent pixels. The leakage current may be generated through conductive layers of an intermediate layer disposed between a pixel electrode (e.g., an anode) and a common electrode (e.g., cathode). The leakage current is known to be a cause of color crosstalk between adjacent pixels.

SUMMARY

Aspects of the present disclosure provide a display device in which at least a portion of an intermediate layer disposed between a pixel electrode and a common electrode is disconnected between adjacent pixels to prevent leakage current and color crosstalk and a mobile electronic device including the display device.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment of the present disclosure, a display device may include a substrate, a driving element layer disposed on the substrate, a wiring layer disposed on the driving element layer and including a power supply wiring, and a light emitting element layer disposed on the wiring layer. The light emitting element layer may include a pixel defining layer defining openings for pixels, a first electrode disposed in each opening of the openings for pixels, a heating wiring disposed on the pixel defining layer around each opening, a connection electrode connecting the heating wiring and the power supply wiring through a contact hole extending through at least a portion of the wiring layer and the pixel defining layer, an intermediate layer covering the first electrode in each of the pixels and the pixel defining layer between the pixels, and including a disconnected portion on the pixel defining layer adjacent to the heating wiring, and a second electrode continuously disposed on the intermediate layer in the openings for the pixels and between the pixels.

The disconnected portion of the intermediate layer and the second electrode covering the disconnected portion of the intermediate layer may be disposed on the pixel defining layer between the pixels, the disconnected portion of the intermediate layer is disconnected from a pixel portion of the intermediate layer disposed in the openings of the pixel defining layer, and the second electrode is continuously disposed on the disconnected portion and the pixel portion of the intermediate layer.

The pixels may include a first pixel and a second pixel, and the openings may include a first opening of the first pixel and a second opening of the second pixel. A first heating wiring around the first opening and a second heating wiring around the second opening may be spaced apart at a predetermined interval on the pixel defining layer between the pixels.

The disconnected portion of the intermediate layer may be disposed between the first heating wiring and the second heating wiring.

The power supply wiring may include a first power supply wiring driving the first heating wiring and a second power supply wiring driving the second heating wiring, the first heating wiring is electrically connected to the first power supply wiring through a first connection electrode extending through the pixel defining layer, and the second heating wiring is electrically connected to the second power supply wiring through a second connection electrode extending through the pixel defining layer.

The first power supply wiring and the second power supply wiring may be spaced apart at the predetermined interval on the wiring layer and are driven independently.

The first power supply wiring and the second power supply wiring may be connected into one wiring on the wiring layer, and a pair of heating wirings surrounding each of the neighboring pixels is electrically connected to one power supply wiring.

A first metal forming the heating wiring, a second metal forming the connection electrode, and a third metal forming the power supply wiring comprise different metals.

The resistance of the first metal is greater than the resistance of the second metal, and the resistance of the second metal may be greater than the resistance of the third metal.

The intermediate layer may include one or more conductive layers having a disconnected portion adjacent to the heating wiring, and the conductive layers may include at least one of a hole injection layer HIL, a hole transport layer HTL, an electron transport layer ETL, a charge generation layer CGL, and a P-doped layer PHIL.

The heating wiring surrounds each opening, and may include an open slit area open in a specific lateral direction.

The intermediate layer and the second electrode may be continuously disposed around the open slit area.

According to an embodiment of the present disclosure, a mobile electronic device may include a display panel. The display panel may include a substrate, a driving element layer disposed on the substrate, a wiring layer disposed on the driving element layer and including a power supply wiring, and a light emitting element layer disposed on the wiring layer. The light emitting element layer may include a pixel defining layer defining openings for pixels, a first electrode disposed in each opening of the openings, a heating wiring disposed on the pixel defining layer around each opening of the pixel defining layer, a connection electrode connecting the heating wiring and the power supply wiring through a contact hole extending through at least a portion of the wiring layer and the pixel defining layer, an intermediate layer covering the first electrode in each of the pixels and the pixel defining layer between the pixels, and including a disconnected portion on the pixel defining layer adjacent to the heating wiring, and a second electrode continuously disposed on the intermediate layer in each of the openings for the pixels and between the pixels.

The disconnected portion of the intermediate layer and the second electrode covering the disconnected portion of the intermediate layer may be disposed on the pixel defining layer between the pixels, the disconnected portion of the intermediate layer is disconnected from a pixel portion of the intermediate layer disposed in the openings of the pixel defining layer, and the second electrode is continuously disposed on the disconnected portion and the pixel portion of the intermediate layer.

Where the openings include a first opening of a first pixel and a second opening of a second pixel, a first heating wiring around the first opening and a second heating wiring around the second opening may be spaced apart at a predetermined interval on the pixel defining layer between the pixels.

The disconnected portion of the intermediate layer may be disposed between the first heating wiring and the second heating wiring.

The power supply wiring may include a first power supply wiring driving the first heating wiring and a second power supply wiring driving the second first heating wiring, the first heating wiring is electrically connected to the first power supply wiring through a first connection electrode extending through the pixel defining layer, and the second heating wiring is electrically connected to the second power supply wiring through a second connection electrode extending through the pixel defining layer.

The first power supply wiring and the second power supply wiring may be spaced apart at the predetermined interval on the wiring layer and are driven independently.

The first power supply wiring and the second power supply wiring may be connected into one wiring on the wiring layer, and a pair of heating wirings surrounding each of the neighboring pixels is electrically connected to one power supply wiring.

A first metal forming the heating wiring, a second metal forming the connection electrode, and a third metal forming the power supply wiring may be different metals, and the resistance of the first metal is greater than the resistance of the second metal, and the resistance of the second metal is greater than the resistance of the third metal.

In a display device according to embodiments and a mobile electronic device including the same, at least a portion of an intermediate layer disposed between a pixel electrode and a common electrode may be disconnected between adjacent pixels. Therefore, leakage current and color crosstalk can be prevented.

However, the effects of the present disclosure are not restricted to the one set forth herein. The above and other effects of the present disclosure will become more apparent to one of skill in the art to which the present disclosure pertains by referencing the claims.

BRIEF DESCRIPTION OF THE DRAWINGS

These and/or other aspects will become apparent and more readily appreciated from the following description of the embodiments, taken in conjunction with the accompanying drawings in which FIG. 1 is a perspective view of a display device according to an embodiment;

FIG. 5 is a schematic cross-sectional view of a portion of the display panel of the display device according to the embodiment;

DETAILED DESCRIPTION OF THE EMBODIMENTS

Figure 2:
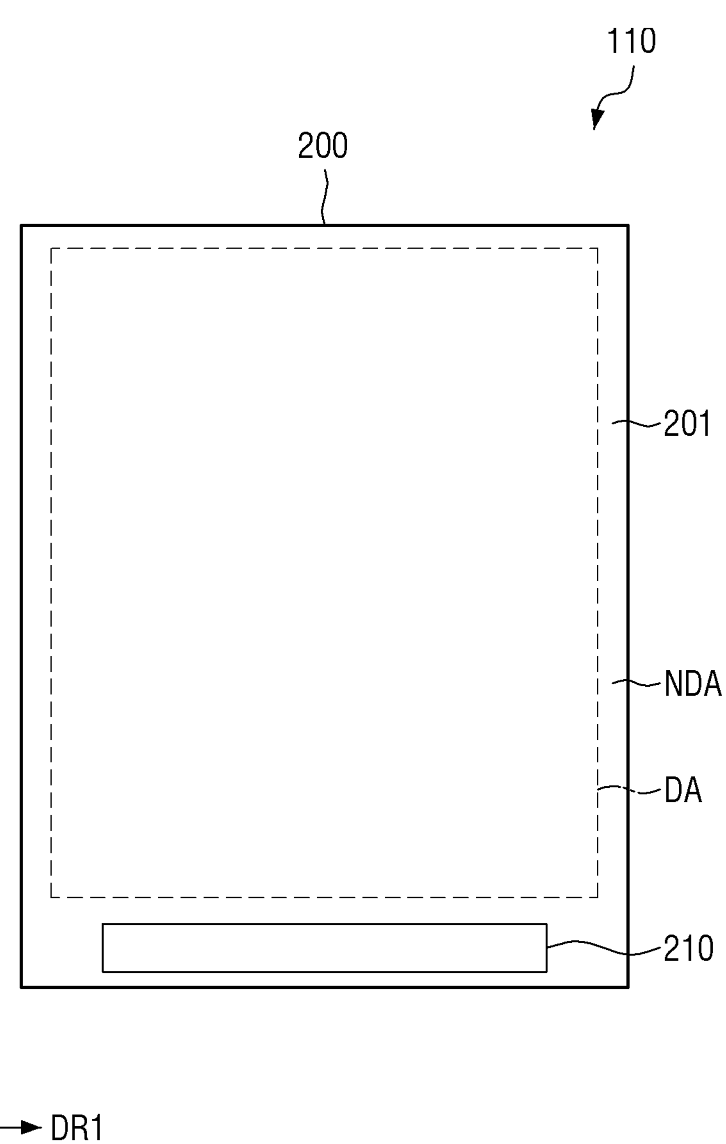
FIG. 2 is a plan view of a display panel according to an embodiment.

The present inventive concept will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. As used herein, “some” and “at least one” means a range between one and all, inclusive.

It will be understood that, although the ordinal terms “first,” “second,” etc. may be used herein to describe various elements, these elements should not be limited to any order by these terms. These terms are used to distinguish one element from another element and may be interchangeable. For instance, a first element discussed below could be termed a second element without departing from the teachings of the present invention. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

Hereinafter, specific embodiments will be described with reference to the accompanying drawings.

Figure 1:
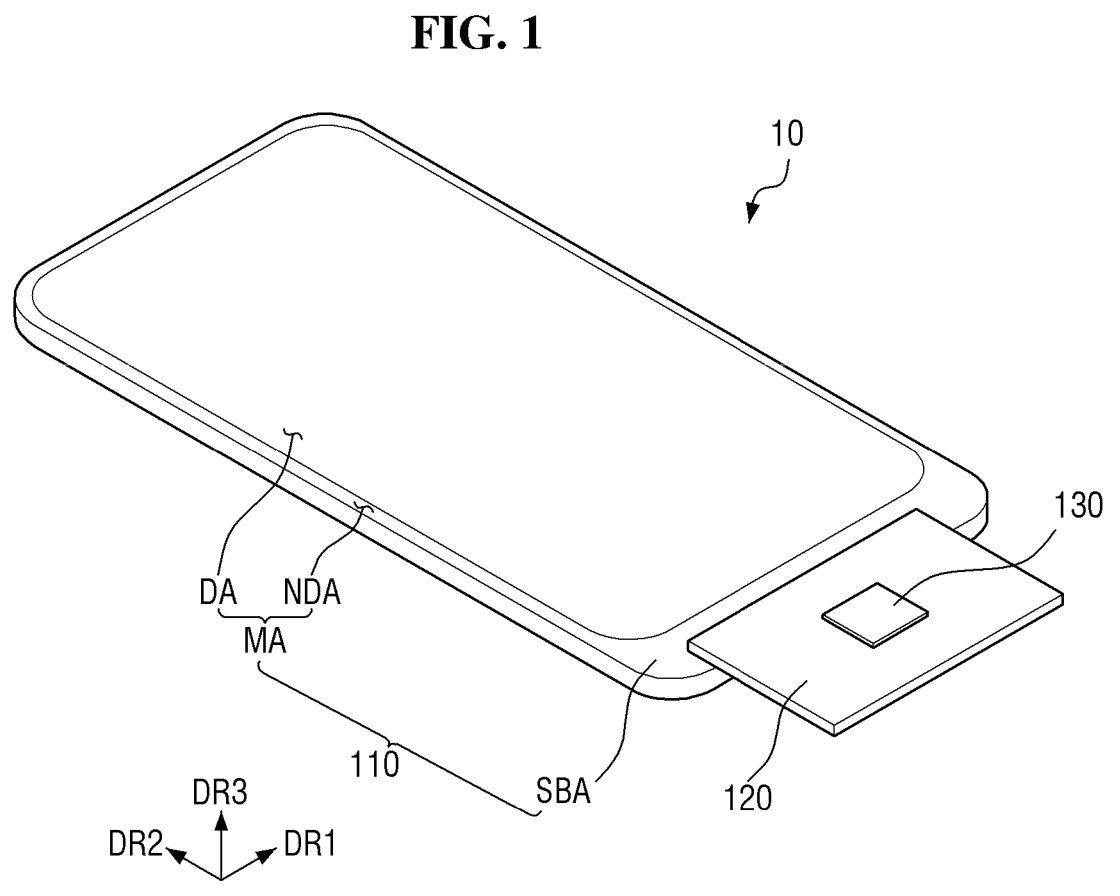

FIG. 1 is a perspective view of a display device according to an embodiment.

Referring to FIG. 1, the display device 10 may be applied to portable electronic devices such as mobile phones, smartphones, tablet personal computers (PCs), mobile communication terminals, electronic notebooks, electronic books, portable multimedia players (PMPs), navigation devices, and ultra-mobile PCs (UMPCs). For example, the display device 10 may be applied as a display unit of a television, a notebook computer, a monitor, a billboard, or an Internet of things (IoT) device. For another example, the display device 10 may be applied to wearable devices such as smart watches, watch phones, glasses-type displays, and head mounted displays (HMDs).

The display device 10 may have a planar shape similar to a quadrangle. For example, the display device 10 may have a planar shape similar to a quadrangle having short sides in a first direction DR1 and long sides in a second direction DR2. Alternatively, the display device 10 may have a planar shape similar to a quadrangle having long sides in the first direction DR1 and short sides in the second direction DR2. In FIG. 1, DR3 represents a normal direction perpendicular to a plane defined by the first direction DR1 and the second direction DR2. Each corner where a short side meets a long side may be rounded with a predetermined curvature or may be right-angled. The planar shape of the display device 10 is not limited to a quadrangular shape but may also be similar to other polygonal shapes, a circular shape, or an elliptical shape.

The display device 10 may include a display panel 110, a circuit board 120, and a power supply unit 130.

The display panel 110 is a display panel 110 using a semiconductor wafer substrate 200 (see FIG. 2) as a base substrate. The display panel 110 may include a main area MA and a sub-area SBA.

The main area MA may include a display area DA including pixels PX (see FIG. 3) displaying an image and a non-display area NDA disposed around the display area DA. The non-display area NDA may be an area other than the display area DA. The display area DA may emit light from a plurality of emission areas or a plurality of opening areas. For example, the display panel 110 may include pixel driving circuits PC (see FIG. 4) which include switching elements and light emitting elements LEL (see FIG. 5), which are self-light emitting elements.

The light emitting elements LEL may include, but are not limited to, at least one of an organic light emitting diode including an organic light emitting layer, a quantum dot light emitting diode including a quantum dot light emitting layer, an inorganic light emitting diode including an inorganic semiconductor, and a micro-light emitting diode.

The non-display area NDA may be an area outside the display area DA. The non-display area NDA may be defined as an edge area of the main area MA of the display panel 110. The non-display area NDA may include fan-out lines (not illustrated) extending from lines (e.g., gate lines, data lines, and emission control lines) of the display area DA and a display pad unit (not illustrated) connecting the fan-out lines and a display driving circuit 210.

The sub-area SBA may extend from a side of the main area MA. The sub-area SBA may include a main pad unit connected to the circuit board 120. Optionally, the sub-area SBA may be omitted, and the main pad unit may be disposed in the non-display area NDA.

The circuit board 120 may be attached onto the main pad unit of the display panel 110 using an anisotropic conductive film (ACF). Lead lines of the circuit board 120 may be electrically connected to the main pad unit of the display panel 110. The circuit board 120 may be a flexible printed circuit board, a printed circuit board, or a flexible film such as a chip on film.

The power supply unit 130 may be disposed on the circuit board 120 to supply a power supply voltage to the display driving circuit 210 and the display panel 110. The power supply unit 130 may generate driving voltages and supply the driving voltages to driving voltage lines. For example, the driving voltages may include a high-potential voltage (a first driving voltage ELVDD of FIG. 4), a low-potential voltage (a second driving voltage ELVSS of FIG. 4) and an initialization voltage VINT (see FIG. 4) for driving the light emitting elements LEL.

FIG. 2 is a plan view of a display panel 110 according to an embodiment.

Referring to FIG. 2, the display panel 110 may be an organic light emitting diode on silicon (OLEDoS) panel using a semiconductor wafer substrate as a base substrate. For example, the display panel 110 may include a substrate 200, and the substrate 200 may be a semiconductor wafer substrate. In this document, a substrate may be, but not necessarily, referred to as a ‘semiconductor substrate’, a ‘semiconductor wafer substrate’, or a ‘wafer’.

According to an embodiment, pixel driving circuits PC (see FIG. 4) and a display driving circuit 210 controlling the pixel driving circuits PC may be disposed on a front surface 201 of the substrate 200. The pixel driving circuits PC are disposed to overlap light emitting elements LEL (see FIG. 5) of pixels PX (see FIG. 3) in the display area DA. The display driving circuit 210 is disposed in the non-display area NDA and drives the pixel driving circuits PC.

The pixel driving circuits PC (see FIG. 4) and the display driving circuit 210 may be formed in a driving element layer 501 (see FIG. 5) disposed on the front surface 201 of the substrate 200. The driving element layer 501 may include, for example, N-type metal oxide semiconductor field effect transistors (MOSFETs) and/or P-type MOSFETs. In this document, the driving element layer 501 (see FIG. 5) may be, but not necessarily, referred to as a ‘MOSFET layer’, a ‘CMOS layer’, a ‘transistor layer’, or a ‘backplane layer’.

Figure 3:
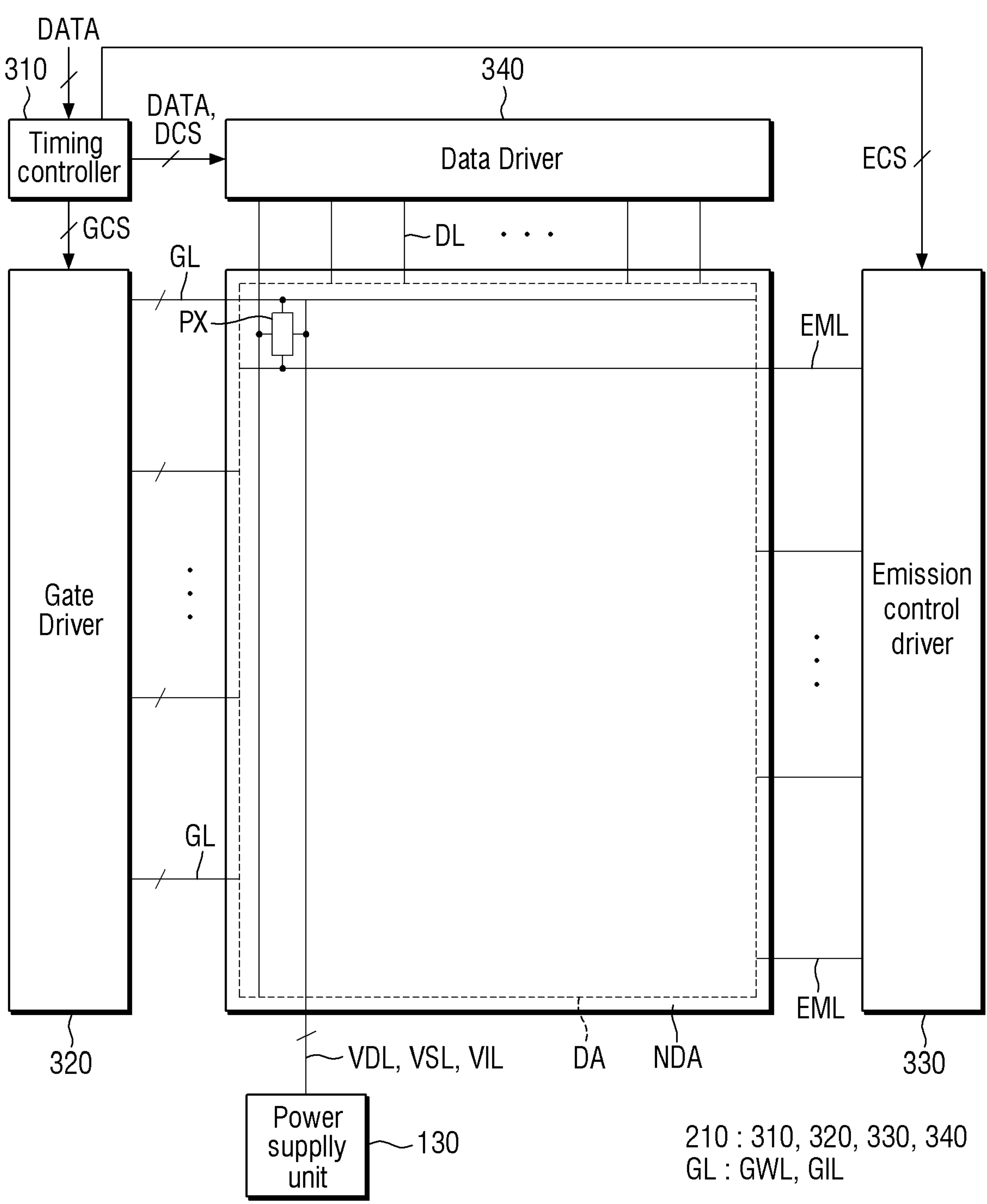
FIG. 3 is a configuration block diagram of the display device according to the embodiment.

FIG. 3 is a configuration block diagram of the display device according to the embodiment.

Referring to FIG. 3, the display device 10 includes the display driving circuit 210 embedded in the display panel 110. The display driving circuit 210 is formed in the driving element layer 501 disposed on the front surface of the substrate 200. Such display driving circuit 210 may include a timing controller 310, a gate driver 320, an emission control driver 330, and a data driver 340, but the present disclosure is not limited thereto. Although not illustrated, the display driving circuit 210 may further include a memory (e.g., OTP), an interface circuit (e.g., I/F), an image processing circuit (e.g., logic), and/or a gamma processing circuit.

The display area DA of the display panel 110 includes a plurality of pixels PX arranged in a matrix form. Each of the pixels PX may be connected to a first driving voltage line VDL, a second driving voltage line VSL, a gate line GL, an emission control line EML, an initialization line VINT, and a data line DL.

The first driving voltage line VDL supplies a first driving voltage ELVDD (see FIG. 4) input from the power supply unit 130 to the pixels PX. The second driving voltage line VSL supplies a second driving voltage ELVSS (see FIG. 4) input from the power supply unit 130 to the pixels PX. The gate lines GL supply gate signals GI and GW (see FIG. 4) input from the gate driver 320 to the pixels PX. The emission control lines EML supply emission control signals EM input from the emission control driver 320 to the pixels PX. The initialization lines VIL supply initialization voltages VINT (see FIG. 4) input from the power supply unit 130 to the pixels PX. The data lines DL supply analog data voltages input from the data driver 340 to the pixels PX.

The first driving voltage ELVDD may be a high-potential voltage, and the second driving voltage ELVSS may be a low-potential voltage. For example, the first driving voltage ELVDD may have a higher potential than the second driving voltage ELVSS. The initialization voltage VINT (see FIG. 4) may have a potential for initializing the pixel driving circuit PC (see FIG. 4) for each frame.

One gate line GL illustrated in FIG. 3 may include a first gate line GWL and a second gate line GIL, but the present disclosure is not limited thereto.

Each of the pixels PX may include a light emitting element LEL (see FIG. 4) and may include a plurality of transistors and at least one capacitor as a pixel driving circuit PC (see FIG. 4) for driving the light emitting element LEL.

The timing controller 310 may receive a data signal DATA and timing signals from the circuit board 120. The timing controller 310 may generate a data control signal DCS based on the timing signals and control the operation timing of the data driver 340 using the data control signal DCS. The timing controller 310 may generate a gate control signal GCS based on the timing signals and control the operation timing of the gate driver 320 using the gate control signal GCS. The timing controller 310 may generate an emission control signal ECS based on the timing signals and control the operation timing of the emission control driver 330 based on the emission control signal ECS.

The data driver 340 may convert the data signal DATA into analog data voltages and supply the analog data voltages to the pixels PX through the data lines DL. Gate signals of the gate driver 320 may select pixels PX to which the data voltages are to be supplied, and the selected pixels PX may receive the data voltages through the data lines DL.

The power supply unit 130 may be disposed on the circuit board 120 to supply a power supply voltage to the display driving circuit 210 and the display panel 110. The power supply unit 130 generates a driving voltage and supplies the driving voltage to a driving voltage line VDL or VSL. The power supply unit 130 may generate a common voltage and supply the common voltage to a second electrode (e.g., a second electrode CAE of FIG. 5) connected to the light emitting elements LEL of the pixels PX.

The gate driver 310 may supply the gate signals GI and GW (see FIG. 4) to the pixels PX through the gate lines GL.

The emission control driver 320 may supply the emission control signals EM (see FIG. 4) to the pixels PX through the emission control lines EML.

Figure 4:
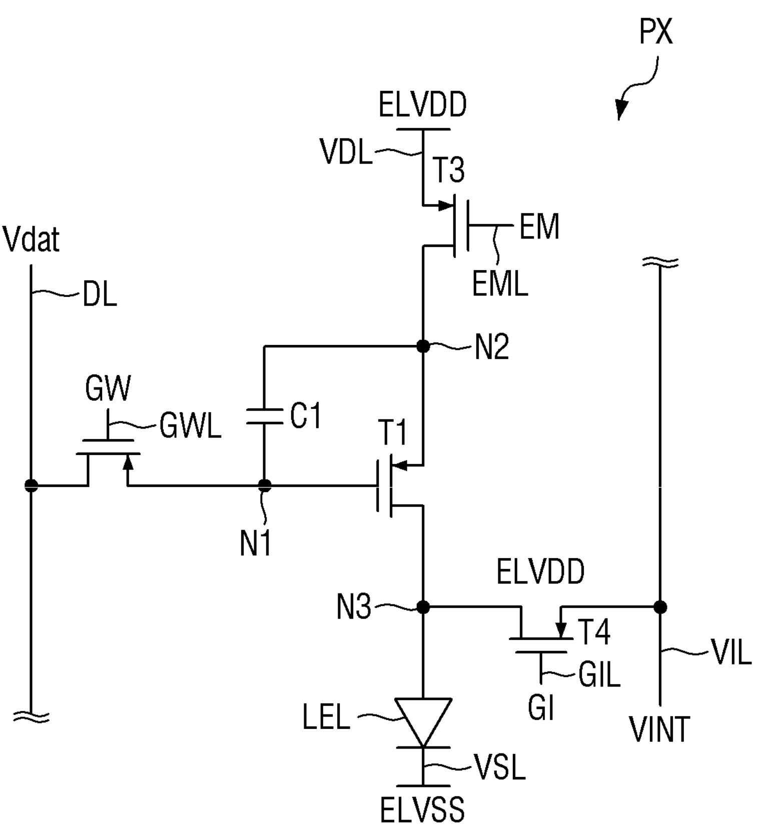
FIG. 4 is a circuit diagram of a pixel of the display device according to the embodiment.

FIG. 4 is a circuit diagram of a pixel of the display device according to the embodiment.

Referring to FIG. 4, the pixel PX may include a light emitting element LEL (e.g., an organic light emitting diode) and a pixel driving circuit PC connected to the light emitting element LEL as a display element. The pixel driving circuit PC may include first through fourth transistors T1 through T4, and a first capacitor C1, but the present disclosure is limited thereto. The first through fourth transistors T1 through T4 may be implemented as N-type MOSFETs and/or P-type MOSFETs. Although the first through fourth transistors T1 through T4 are illustrated as P-type MOSFETs in FIG. 4, the present disclosure is not limited thereto.

The first transistor T1 may be a driving transistor in which the magnitude of a source-drain current is determined according to a gate-source voltage, and each of the second through fourth transistors T2 through T4 may be a switching transistor that is turned on/off according to a gate-source voltage or substantially a gate voltage.

The first transistor T1 includes a gate connected to a first node N1, a source connected to a second node N2, and a drain connected to a third node N3. The first transistor T1 is turned on or off based on a voltage level of the first node N1. The turned-on first transistor T1 connects the second node N2 and the third node N3. The second node N2 is a node connected to a source of the third transistor T3 and supplied with a first driving voltage ELVDD when the third transistor T3 is turned on in response to an emission control signal EM. The third node N3 is a node to which the first electrode ANE (see FIG. 5) of the light emitting element LEL and a drain of the fourth transistor T4 are connected. The third node N3 is a node to which an initialization voltage VINT is supplied when the fourth transistor T4 is turned on in response to a second gate signal GI.

The second transistor T2 includes a gate connected to a first gate line GWL, a source connected to a data line, and a drain connected to the first node N1. The second transistor T2 is turned on in response to a first gate signal GW supplied from the first gate line GWL. The turned-on second transistor T2 supplies a data signal Vdat supplied from the data line to the first node N1.

The third transistor T3 includes a gate connected to an emission control line EML, a source connected to a first driving voltage line VDL to which the first driving voltage ELVDD is supplied, and the drain connected to the second node N2. The third transistor T3 is turned on in response to the emission control signal EM supplied from the emission control line EML. The turned-on third transistor T3 supplies the first driving voltage ELVDD to the second node N2.

The fourth transistor T4 includes a gate connected to a second gate line GIL, a source connected to the initialization line VIL to which the initialization voltage VINT is supplied, and the drain connected to the third node N3. The fourth transistor T4 is turned on in response to the second gate signal GI supplied from the second gate line GIL. The turned-on fourth transistor T4 supplies the initialization voltage VINT to the third node N3.

The first capacitor C1 is disposed between the first node N1 and the second node N2. The first capacitor C1 serves to store the data signal Vdat input through the second transistor T2.

The light emitting element LEL may include the first electrode (e.g., the first electrode ANE of FIG. 5), a second electrode (e.g., a second electrode CAE of FIG. 5) facing the first electrode, and an intermediate layer disposed between the first electrode and the second electrode. The intermediate layer may include an organic light emitting layer. The second electrode may receive the second driving voltage ELVSS. The second electrode may be connected to the second driving voltage line VSL that transmits the second driving voltage ELVSS. The second electrode may be connected to a plurality of pixels PX.

Figure 5:
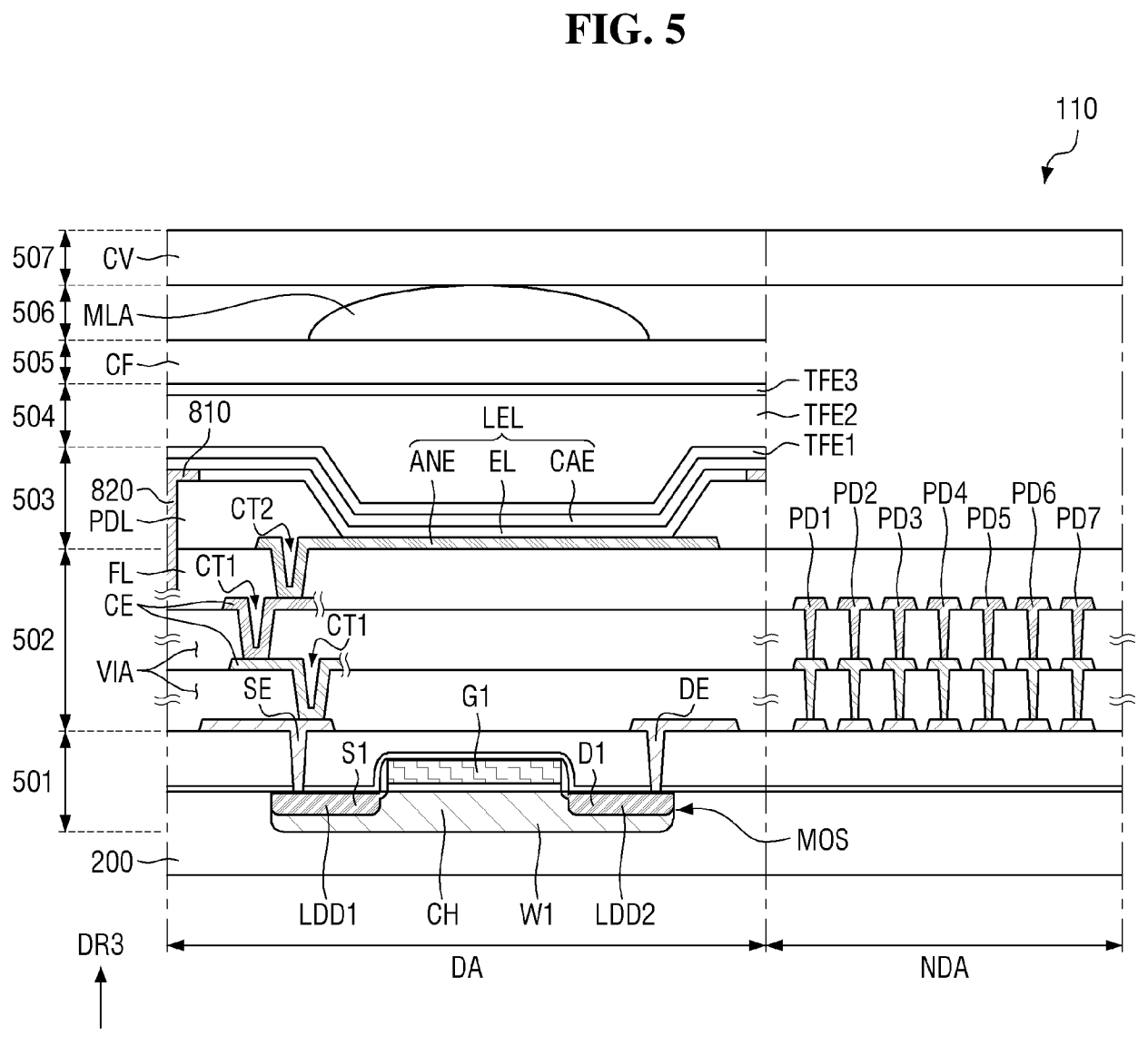

FIG. 5 is a schematic cross-sectional view of a portion of the display panel 110 of the display device 10 according to the embodiment. For example, FIG. 5 schematically illustrates the stacked structure of each of the non-display area NDA and the display area DA of the display panel 110 according to the embodiment.

In the description with reference to FIG. 5, the expression "on" may mean a third direction DR3, and a front surface of a substrate 200 faces the third direction DR3. The front surface of the substrate 200 may refer to a direction in which each light emitting element LEL disposed in the display area DA emits light for displaying an image.

Referring to FIG. 5, the display panel 110 according to the embodiment may include the substrate 200, and the substrate 200 may be a semiconductor wafer substrate.

A driving element layer 501 including a display driving circuit 210 and a pixel driving circuit PC, at least one wiring layer 502, a light emitting element layer 503 including a light emitting element LEL, an encapsulation layer 504 covering the light emitting element LEL, a color filter layer 505 including a color filter CF, a light control layer 506 including a refractive layer MLA, and a cover layer 507 including a cover member CV may be sequentially stacked on the front surface of the substrate 200. At least one of the light emitting element layer 503, the encapsulation layer 504, the color filter layer 505, the light control layer 506, and the cover layer 507 may not be disposed in the non-display area NDA.

The substrate 200 may be a silicon substrate, a germanium substrate, or a silicon-germanium substrate. The substrate 200 may be a substrate doped with first-type impurities.

The driving element layer 501 including an N-type MOSFET and/or a P-type MOSFET is disposed on the substrate 200. The first-type impurities may be P-type impurities, and second-type impurities may be N-type impurities. Alternatively, the first-type impurities may be N-type impurities, and the second-type impurities may be P-type impurities.

In this document, an N-type MOSFET MOS included in the driving element layer 501 will be described as an example. The N-type MOSFET MOS may include a well region W1 doped with N-type impurities in a substrate doped with P-type impurities.

The well region W1 may include a first low-concentration impurity region LDD1 and a second low-concentration impurity region LDD2 having a relatively lower impurity concentration than other portions. The first low-concentration impurity region LDD1 may define a source region S1, and the second low-concentration impurity region LDD2 may define a drain region DI. A source electrode SE of the MOSFET MOS may be connected to the source region S1, and a drain electrode DE of the MOSFET MOS may be connected to the drain region DI.

A channel CH is defined between the first low-concentration impurity region LDD1 and the second low-concentration impurity region LDD2 to overlap a gate G1. An oxide layer (not illustrated) which is an insulating layer may be disposed between the gate G1 and the well region W1.

MOSFETs MOS constitute the display driving circuit 210 (see FIG. 2), and the display driving circuit 210 is disposed in the non-display area NDA of the display panel 110. In addition, MOSFETs MOS constitute transistors (T1 through T4 of FIG. 4) included in a pixel driving circuit PC, and the pixel driving circuit PC is disposed in the display area DA of the display panel 110. That is, each pixel driving circuit PC is a circuit including a combination of MOSFETs MOS disposed in the driving element layer 501 to correspond to the display area DA. In addition, the display driving circuit 210 is a circuit including a combination of MOSFETs MOS disposed in the driving element layer 501 to correspond to the non-display area NDA. For case of description, FIG. 5 illustrates any one MOSFET MOS of the pixel driving circuit PC disposed in the display area DA of the display panel 110 as an example.

At least one wiring layer 502 is disposed on the driving element layer 501. The at least one wiring layer 502 includes insulating layers VIA sequentially stacked on the driving element layer 501 and connection electrodes CE and wirings (not illustrated) connected to the MOSFETs MOS through contact holes CT1 at least partially penetrating the insulating layers VIA. That is, the wiring layers 502 include the connection electrodes CE and the connection wirings for connecting the MOSFETs MOS of the driving element layer 501 to each other and the insulating layers VIA for insulating them from each other. In addition, the wiring layers 502 may include a plurality of signal wirings for driving the display panel 110 and a plurality of power supply wirings.

The connection electrodes CE illustrated in FIG. 5 connect a MOSFET MOS corresponding to a pixel driving circuit PC among a plurality of MOSFETs MOS disposed in the driving element layer 501 to a light emitting element LEL disposed on the wiring layer 502 in a vertical direction. Here, the vertical direction means a normal direction DR3 of the display panel 110.

Wirings (not illustrated) disposed in the wiring layer 502 include lines (e.g., GL, DL and EML of FIG. 3) connected to the pixel driving circuit PC. The wirings disposed in the wiring layer 502 further include fan-out lines (not illustrated) extending from the lines (e.g., GL, DL and EML of FIG. 3) connected to the pixel driving circuit PC and disposed in the non-display area NDA.

The wiring layer 502 may include pad electrodes PD1 through PD7 disposed to correspond to the non-display area NDA. The pad electrodes PD1 through PD7 include a first gate pad PD1 to which a first gate line GWL is connected, a second gate pad PD2 to which a second gate line GIL is connected, an initialization pad PD3 to which an initialization line VIL is supplied, an emission pad PD4 to which an emission control line EML is connected, a data pad PD5 to which a data line DL is connected, a first driving voltage pad PD6 to which a first driving voltage line VDL is connected, and a second driving voltage pad PD7 to which a second driving voltage line VSL is connected. However, the pad electrodes PD1 through PD7 illustrated in FIG. 5 are examples, and the present disclosure is not limited thereto.

A planarization layer FL including an organic layer may be disposed on an uppermost layer among the insulating layers VIA included in the wiring layer 502.

A pixel defining layer PDL defining a plurality of pixels PX and the light emitting element layer 503 including a light emitting element LEL may be disposed on the wiring layer 502. The light emitting element LEL includes a first electrode ANE connected to the MOSFET MOS included in the pixel driving circuit PC through a contact hole CT2 and the connection electrodes CE, an intermediate layer ML disposed on the first electrode ANE (see FIG. 6), and a second electrode CAE disposed on the intermediate layer ML. The pixel defining layer PDL includes openings OP (see FIG. 8) corresponding to the pixels PX, respectively, and a portion of the first electrode ANE of the light emitting element LEL may be exposed in each opening OP.

The intermediate layer ML may include a hole injection layer HIL, a hole transport layer HTL, a light emitting layer, an electron transport layer ETL, and an electron injection layer EIL, but the present disclosure is not limited thereto. For example, the light emitting element LEL may be an RGB-type light emitting element LEL that emits light of a first color (e.g., red light) in a first pixel PX1 (e.g., a red pixel), emits light of a second color (e.g., green light) in a second pixel PX2 (e.g., a green pixel), and emits light of a third color (e.g., blue light) in a third pixel PX3 (e.g., a blue pixel). Alternatively, the light emitting element LEL may be a white OLED (WOLED)-type light emitting element LEL that emits white light in all of the first pixel PX1 (e.g., the red pixel), the second pixel PX2 (e.g., the green pixel), and the third pixel PX3 (e.g., the blue pixel).

A stacked structure of organic materials included in the intermediate layer ML may be different depending on whether the light emitting element LEL is of the RGB type or the WOLED type, but the present disclosure is not limited thereto.

A heating wiring 810 is disposed on the pixel defining layer PDL, and the heating wiring 810 causes the intermediate layer ML of the light emitting element LEL to be disconnected between adjacent pixels PX during a process. The disconnection of the intermediate layer ML occurs in a process of applying the driving voltage (or driving current) to the heating wiring 810. The process of applying driving voltage (or driving current) to the heating wiring 810 may be performed after the intermediate layer ML is deposited. As will be described later, the process of applying the driving voltage (or driving current) to the heating wiring 810 may be performed before a process of depositing the second electrode CAE or after the process of depositing the second electrode CAE.

According to an embodiment, the heating wiring 810 is electrically connected to the power supply wirings 830 (see FIG. 8) provided on the wiring layer through a connection electrode 820 vertically penetrating the pixel defining layer PDL. The heating wiring 810 is configured to receive the driving voltage (or driving current) through the power supply wirings 830 and the connection electrode 820 and generate heat in response to the received driving voltage (or driving current). The temperature of the heating wiring 810 may be raised to a high temperature of about 400° C. or higher by the received driving voltage (or driving current), and the intermediate layer ML deposited on and around the heating wiring 810 may be removed by the high temperature.

In an embodiment, the intermediate layer ML of the light emitting element LEL may be disconnected between adjacent pixels PX, thereby preventing leakage current between the adjacent pixels PX and preventing color crosstalk. Hence, the intermediate layer ML includes a disconnected portion between pixels and a pixel portion, the pixel portion being approximately on the first electrode ANE. The color crosstalk refers to a phenomenon in which, for example, a red pixel (e.g., the first pixel PX1) adjacent to a blue pixel (e.g., the third pixel PX3) is unintentionally turned on while the blue pixel is emitting blue light. The color crosstalk occurs due to the leakage current and may occur when the blue pixel and the red pixel having a large difference in voltage that drives the pixels are adjacent to each other. For example, the leakage current is a phenomenon in which while a driving current is being supplied to the light emitting element LEL of the blue pixel to turn on the blue pixel, a portion of the driving current is transmitted to the red pixel (e.g., the first pixel PX1) through some conductive layers of the intermediate layer ML. When the leakage current is generated, the red pixel may be unintentionally turned on with the blue pixel.

The encapsulation layer 504 including at least one organic encapsulation layer and at least one inorganic encapsulation layer may be disposed on the light emitting element layer 503. For example, the encapsulation layer 504 may include a first encapsulation inorganic layer TFE1, an encapsulation organic layer TFE2, and a second encapsulation inorganic layer TFE3, but the present disclosure is not limited thereto.

The color filter layer 505 including the color filter CF may be disposed on the encapsulation layer 504. The color filter CF may include a first color filter CF1 that transmits red light, a second color filter CF2 that transmits green light, or a third color filter CF3 that transmits blue light, but the present disclosure is not limited thereto. The color filter layer 505 may be provided when the light emitting element LEL of the light emitting element layer 503 is a WOLED-type light emitting element LEL. If the light emitting element LEL of the light emitting element layer 503 is an RGB-type light emitting element LEL that directly emits red light, green light or blue light, the color filter layer 505 may be omitted.

The light control layer 506 including the refractive layer MLA is disposed on the color filter layer 505. The refractive layer MLA may refract light emitted from the light emitting element layer 503 that propagates in the normal direction DR3 of the display panel 110. The refractive layer MLA may include a micro-lens array.

The cover layer 507 serving as a cover of the display panel 110 may be disposed on the light control layer 506. The cover layer 507 may include the cover member CV made of glass, but the present disclosure is not limited thereto. The cover layer 507 may include, for example, a protective film.

Figure 6:
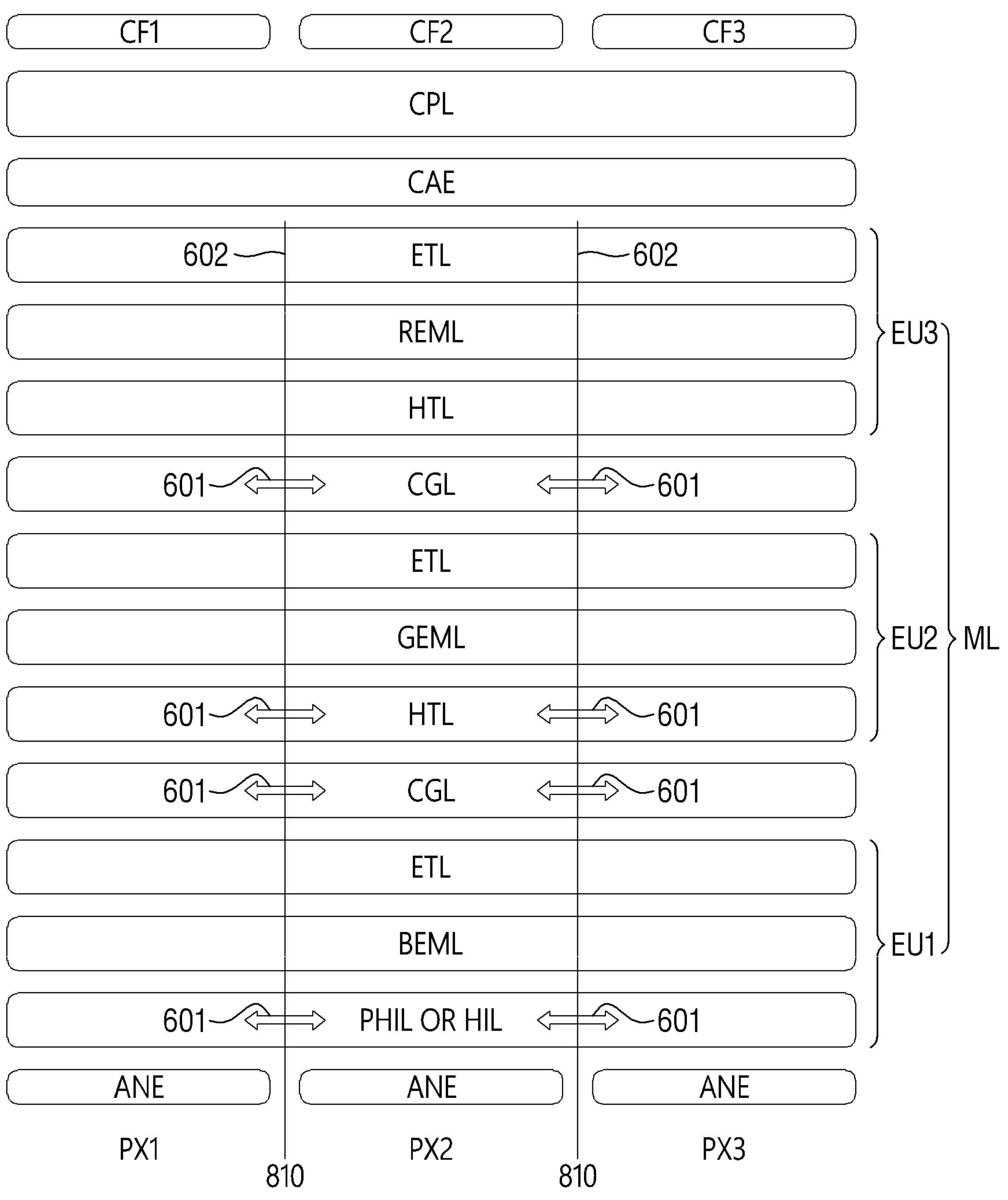
FIG. 6 is a cross-sectional view schematically illustrating the stacked structure of a light emitting element according to an embodiment.

FIG. 6 is a cross-sectional view schematically illustrating the stacked structure of a light emitting element LEL according to an embodiment. For example, FIG. 6 illustrates the stacked structure of the intermediate layer ML when the light emitting element LEL of the light emitting element layer 503 is a WOLED-type light emitting element LEL.

Referring to FIG. 6, a display panel 110 according to an embodiment may include a plurality of pixels PX including a first pixel PX1 for displaying a first color (e.g., red), a second pixel PX2 for displaying a second color (e.g., green), and a third pixel PX3 for displaying a third color (e.g., blue).

A light emitting element LEL disposed in each of the first pixel PX1, the second pixel PX2, and the third pixel PX3 emits white light. The display panel 110 displays the first color, the second color, and the third color using color filters. For example, white light emitted from the first pixel PX1 passes through a first color filter CF1 to display the first color, white light emitted from the second pixel PX2 passes through a second color filter CF2 to display the second color, and white light emitted from the third pixel PX3 passes through a third color filter CF3 to display the third color.

A first electrode ANE (e.g., a pixel electrode or an anode electrode) is disposed in each of the first pixel PX1, the second pixel PX2, and the third pixel PX3. An intermediate layer ML and a second electrode CAE are disposed on the first electrode ANE of each of the first pixel PX1, the second pixel PX2, and the third pixel PX3.

The intermediate layer ML and the second electrode CAE may be common layers shared among the first pixel PX1, the second pixel PX2 and the third pixel PX3 and continuous in at least some areas between the pixels PX.

The intermediate layer ML may include a first emission unit EU1, a charge generation layer CGL, a second emission unit EU2, a charge generation layer CGL, and a third emission unit EU3 sequentially stacked on the first electrode ANE of each of the first pixel PX1, the second pixel PX2 and the third pixel PX3, but the present disclosure is not necessarily limited thereto. That is, the stacking order and structure of the intermediate layer ML can be variously changed.

The first emission unit EU1 may include a hole injection layer HIL or a P-doped layer PHIL doped with a P-type semiconductor, a blue light emitting layer BEML, and an electron transport layer ETL. The second emission unit EU2 may include a hole transport layer HTL, a green light emitting layer GEML, and an electron transport layer ETL. The third emission unit EU3 may include a hole transport layer HTL, a red light emitting layer REML, and an electron transport layer ETL.

The charge generation layer CGL is disposed between the first emission unit EU1 and the second emission unit EU2. In addition, the charge generation layer CGL may be disposed between the second emission unit EU2 and the third emission unit EU3. The charge generation layer CGL may include a negative charge generation layer and a positive charge generation layer.

The second electrode CAE is disposed on the third emission unit EU3. The second electrode CAE may be a common layer shared among the first pixel PX1, the second pixel PX2 and the third pixel PX3 and continuous in at least some areas between the pixels PX.

A capping layer CPL may be disposed on the second electrode CAE. Although not illustrated, the encapsulation layer 504 (see FIG. 5) may be disposed on the capping layer CPL, and the first color filter CF1, the second color filter CF2 and the third color filter CF3 may be disposed on the encapsulation layer 504. The capping layer CPL may improve luminous efficiency through the principle of constructive interference.

In the display panel 110 according to the embodiment, since the intermediate layer ML disposed between the first electrode ANE and the second electrode CAE are shared by the first pixel PX1, the second pixel PX2 and the third pixels PX3 and continuous in at least some areas between the pixels PX, a leakage current may be generated. The leakage current may flow between adjacent pixels PX through conductive layers included in the intermediate layer ML, as indicated by arrows 601 in FIG. 6.

The display panel 110 according to the embodiment includes a heating wiring 810 in an area between a plurality of pixels PX to prevent leakage current. For example, the heating wiring 810 is disposed on the pixel defining layer PDL between neighboring pixels PX. The heating wiring 810 disposed between neighboring pixels PX is driven before or after the process of depositing the second electrode CAE. When the heating wiring 810 is driven, high-temperature heat is generated, and the generated high-temperature heat causes some conductive layers included in the intermediate layer ML to be disconnected to form the disconnected portion. In the present disclosure, since some conductive layers included in the intermediate layer ML are disconnected around the heating wiring 810 between neighboring pixels PX as indicated by solid lines 602 in FIG. 6, leakage current and color crosstalk can be prevented.

Figure 7:
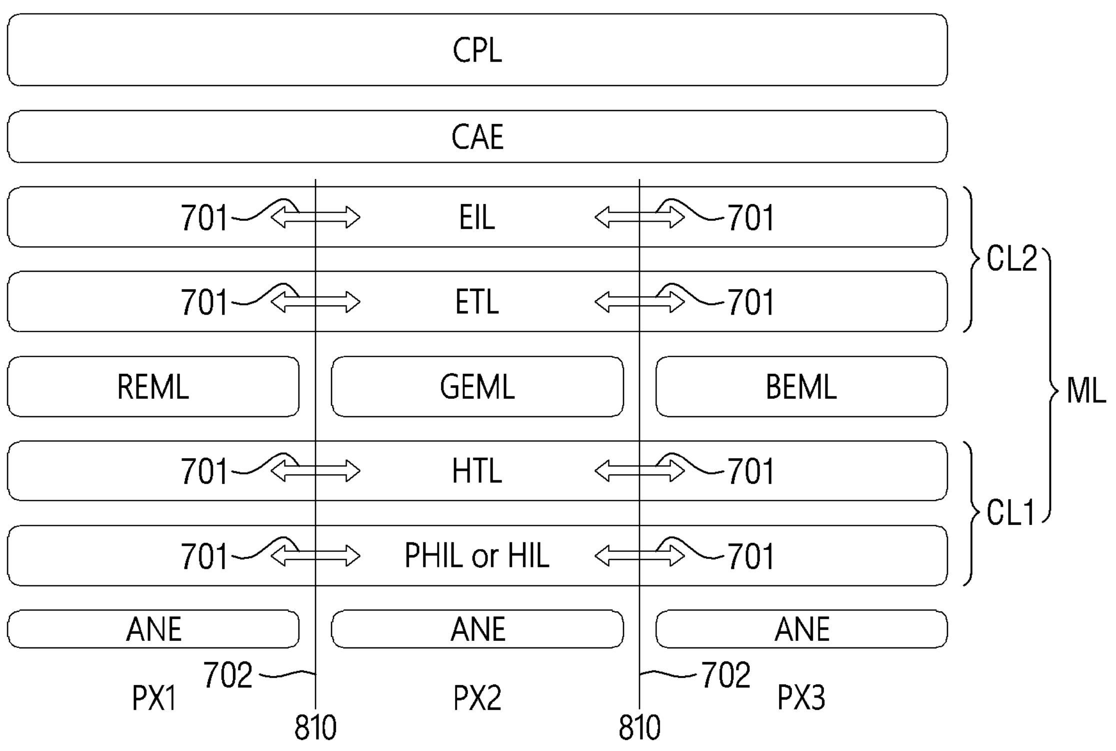
FIG. 7 is a cross-sectional view schematically illustrating the stacked structure of a light emitting element according to an embodiment.

FIG. 7 is a cross-sectional view schematically illustrating the stacked structure of a light emitting element LEL according to an embodiment. For example, FIG. 7 illustrates the stacked structure of an intermediate layer ML when the light emitting element LEL of the light emitting element layer 503 is an RGB-type light emitting element LEL that directly emits red light in a first pixel PX1, green light in a second pixel PX2, and blue light in a third pixel PX3.

Referring to FIG. 7, a display panel 110 according to an embodiment may include a plurality of pixels PX including a first pixel PX1 for displaying a first color (e.g., red), a second pixel PX2 for displaying a second color (e.g., green), and a third pixel PX3 for displaying a third color (e.g., blue).

Each of the first pixel PX1, the second pixel PX2, and the third pixel PX3 may directly emit light of a designated color. For example, a light emitting element LEL in the first pixel PX1 may include a red light emitting layer REML to emit red light from a first emission area, a light emitting element LEL in the second pixel PX2 may include a green light emitting layer GEML to emit green light from a second emission area, and a light emitting element LEL in the third pixel PX3 may include a blue light emitting layer BEML to emit blue light from a third emission area. Here, the first emission area is an area where a first electrode ANE provided in the first pixel PX1 is covered by the intermediate layer ML, the second emission area is an area where a first electrode ANE provided in the second pixel PX2 is covered by the intermediate layer ML, and a third emission area is an area where a first electrode ANE provided in the third pixel PX3 is covered by the intermediate layer ML.

The first electrode ANE (e.g., a pixel electrode or an anode electrode) is disposed in each of the first pixel PX1, the second pixel PX2, and the third pixel PX3. The intermediate layer ML and a second electrode CAE are disposed on the first electrode ANE of each of the first pixel PX1, the second pixel PX2, and the third pixel PX3. A first common layer CL1 (e.g., a lower common layer), a light emitting layer and a second common layer CL2 (e.g., an upper common layer) are disposed in the intermediate layer ML, and the second electrode CAE is disposed on the intermediate layer ML.

The first common layer CL1, the second common layer CL2, and the second electrode CAE may be common layers shared by the first pixel PX1, the second pixel PX2 and the third pixel PX3 and continuous in some areas between the pixels PX. On the other hand, different light emitting layers REML, GEML and BEML may be respectively disposed in the first pixel PX1, the second pixel PX2, and the third pixel PX3 between the first common layer CL1 and the second common layer CL2. For example, the red light emitting layer REML may be disposed in the first pixel PX1, the green light emitting layer GEML may be disposed in the second pixel PX2, and the blue light emitting layer BEML may be disposed in the third pixel PX3. The light emitting layers REML, GEML and BEML may be disconnected at the boundary of each pixel PX.

The first common layer CL1 may be a layer disposed under the light emitting layers REML, GEML and BEML and may include a hole injection layer HIL or a P-doped layer PHIL doped with a P-type semiconductor and a hole transport layer HTL. However, the present disclosure is not limited thereto. For example, the first common layer CL1 may include at least one hole injection layer HIL and at least one hole transport layer HTL.

The second common layer CL2 may be a layer disposed on the light emitting layers REML, GEML and BEML and may include an electron transport layer ETL and an electron injection layer EIL. However, the present disclosure is not limited thereto. For example, the second common layer CL2 may include at least one electron transport layer ETL and at least one electron injection layer EIL.

A capping layer CPL may be disposed on the second electrode CAE. The capping layer CPL may improve luminous efficiency through the principle of constructive interference.

Unlike the embodiment of FIG. 6, the embodiment of FIG. 7 does not include color filters.

As in the embodiment of FIG. 6, in the display panel 110 according to the embodiment illustrated in FIG. 7, the first common layer CL1 and the second common layer CL2 disposed between the first electrode ANE and the second electrode CAE are shared among the first pixel PX1, the second pixel PX2 and the third pixel PX3 and are continuous in some areas between the pixels PX. Therefore, a leakage current may be generated through the first common layer CL1 and the second common layer CL2. The leakage current may flow between adjacent pixels PX through conductive layers included in the first common layer CL1 and the second common layer CL2, as indicated by arrows 701 in FIG. 7.

The display panel 110 according to the embodiment of the present disclosure includes a heating wiring 810 in an area between a plurality of pixels PX to prevent leakage current and causes some conductive layers included in the intermediate layer ML to be disconnected using the heating wiring 810. In the present disclosure, since some conductive layers included in the intermediate layer ML are disconnected around the heating wiring 810 between neighboring pixels PX as indicated by solid lines 702 in FIG. 7, leakage current and color crosstalk can be prevented. In this document, some conductive layers of the intermediate layer ML which are disconnected around the heating wiring 810 may include at least one of the hole injection layer HIL, the hole transport layer HTL, the electron transport layer ETL, and the electron injection layer EIL.

Figure 8:
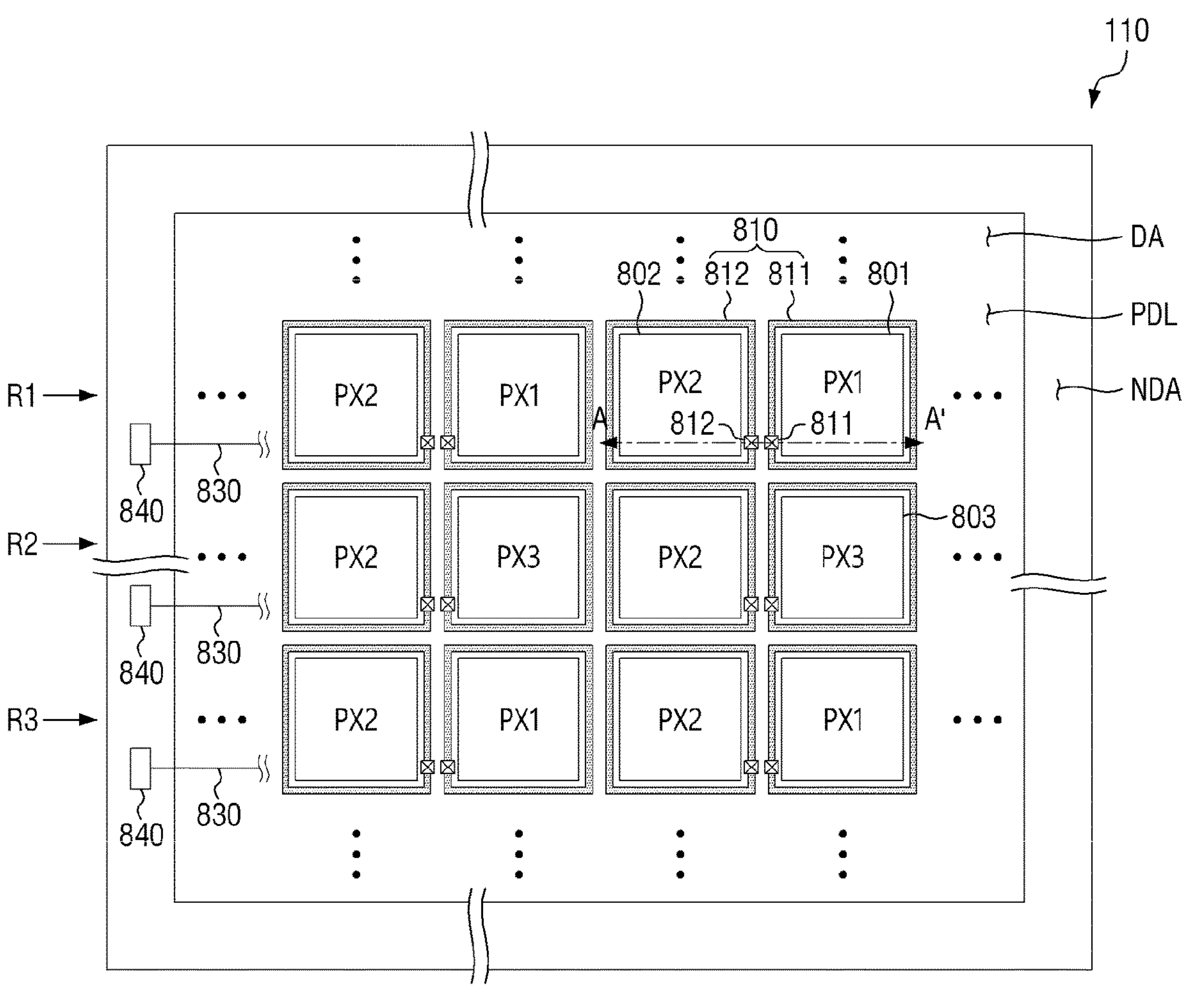
FIG. 8 is a schematic plan view of a portion of a display area of a display panel according to an embodiment.

FIG. 8 is a schematic plan view of a portion of a display area of a display panel 110 according to an embodiment. For example, FIG. 8 may be a plan view illustrating a portion of the display panel 110 viewed in a normal direction perpendicular to an upper surface of the display panel 110 (or a substrate 200).

Referring to FIG. 8, the display panel 110 includes a plurality of pixels PX including first pixels PX1, second pixels PX2, and third pixels PX3. The pixels PX are arranged in a matrix form in the display area DA of the display panel 110. For example, the first pixels PX1 and the second pixels PX2 may be alternately disposed in each of odd-numbered rows R1 and R3 in which a plurality of pixels PX are disposed, and the second pixels PX2 and the third pixels PX3 may be alternately disposed in each even-numbered row R2. In addition, the first pixels PX1 disposed in the odd-numbered rows R1 and R3 and the third pixels PX3 disposed in the even-numbered row R2 are disposed adjacent to each other in a column direction (i.e., a vertical direction), and the second pixels PX2 disposed in the odd-numbered rows R1 and R3 and the second pixels PX2 disposed in the even-numbered row R2 are disposed adjacent to each other in the column direction (i.e., the vertical direction). Some of the first pixels PX1, the second pixels PX2, and the third pixels PX3 illustrated in FIG. 8 may be replaced with fourth pixels (not illustrated) displaying white light. The arrangement of the pixels PX illustrated in FIG. 8 is an example, and the present disclosure is not limited thereto.

In FIG. 8, solid lines (e.g., 801, 802 and 803 in FIG. 8) indicating areas of the first pixels PX1, the second pixels PX2 and the third pixels PX3 indicate openings OP of a pixel defining layer PDL which are disposed in the first pixels PX1, the second pixels PX2, and the third pixels PX3, respectively. For example, the first pixels PX1 may be defined in first openings 801 of the pixel defining layer PDL, the second pixels PX2 may be defined in second openings 802 of the pixel defining layer PDL, and the third pixels PX3 may be defined in third openings 803 of the pixel defining layer PDL. In FIG. 8, an area outside the solid lines (e.g., 801, 802 and 803 in FIG. 8) may be interpreted as an area where the pixel defining layer PDL is substantially disposed.

According to an embodiment, a heating wiring 810 may be disposed between a plurality of pixels PX. The heating wiring 810 is disposed on the pixel defining layer PDL and surrounds each opening OP of the pixel defining layer PDL. For example, a first heating wiring 811 is disposed around the first opening 801 corresponding to each of the first pixels PX1 and surrounds the first opening 801. A second heating wiring 812 is disposed around the second opening 802 corresponding to each of the second pixels PX2 and surrounds the second opening 802. Similarly, a heating wiring 810 may surround the third opening 803 corresponding to each of the third pixels PX3.

According to an embodiment, the heating wirings 810 may be driven independently of each other. The heating wirings 810 may be individually provided around the openings OP, respectively, and may be electrically connected to power supply wirings 830 through contact holes CT810. For example, the first heating wirings 811 surrounding the first openings 801 may be electrically connected to the power supply wirings 830 through first contact holes CT811. The second heating wirings 812 surrounding the second openings 802 may be electrically connected to the power supply wirings 830 through second contact holes CT812. Such contact holes CT810 may be disposed in an area surrounding each opening OP, and the positions of the contact holes CT810 are not limited to those of the illustrated example.

According to an embodiment, the power supply wirings 830 may be disposed in a mesh shape on the wiring layer 502 positioned below the light emitting element layer 503 and supply driving voltages (or driving currents) to the heating wirings 810 through the contact holes CT810. Such power supply wirings 830 may be located on the same layer as any one of the connection electrodes 820 of the wiring layer 502 described with reference to FIG. 5.

According to an embodiment, the power supply wiring 830 may extend to the non-display area NDA and be connected to the power pad 840. The power pads 840 may be disposed in the non-display area NDA and a single power pad 840 or a plurality of power pads 840 may be included. That is, in the illustrated example, the plurality of power pads 840 are described to be disposed in the non-display area NDA, but a single power pad 840 may also be disposed in one area of the non-display area NDA. The power pad 840 may serve to apply the driving voltage (or driving current) to the power supply wiring 830. The driving voltage (or driving current) supplied to the power supply wiring 830 may be provided to each heating wiring 810 disposed on the pixel defining layer PDL through contact holes CT810.

According to an embodiment, the power supply wiring 830 may be, for example, a supply wiring for a low-potential voltage (second driving voltage ELVSS (see FIG. 4)). For example, the low-potential voltage supply wiring may serve to supply a driving voltage (or driving current) to the heating wiring 810 during the manufacturing process of the display panel 110. The low-potential voltage supply wiring may be used as a wiring for supplying a low-potential voltage (second driving voltage ELVSS (see FIG. 4)) after manufacturing of the display panel 110 is completed.

Although not illustrated, each heating wiring 810 may form a current path by being connected to the ground through a dummy contact hole (not illustrated). For example, a driving voltage (or a driving current) input to each heating wiring 810 through a power supply wiring 830 may form a current path flowing to the outside through the dummy contact hole. To this end, the present disclosure may further include the dummy contact hole (not illustrated) and a ground connection electrode 820 connecting a ground wiring (not illustrated) and the heating wiring 810 through the dummy contact hole.

Figure 9:
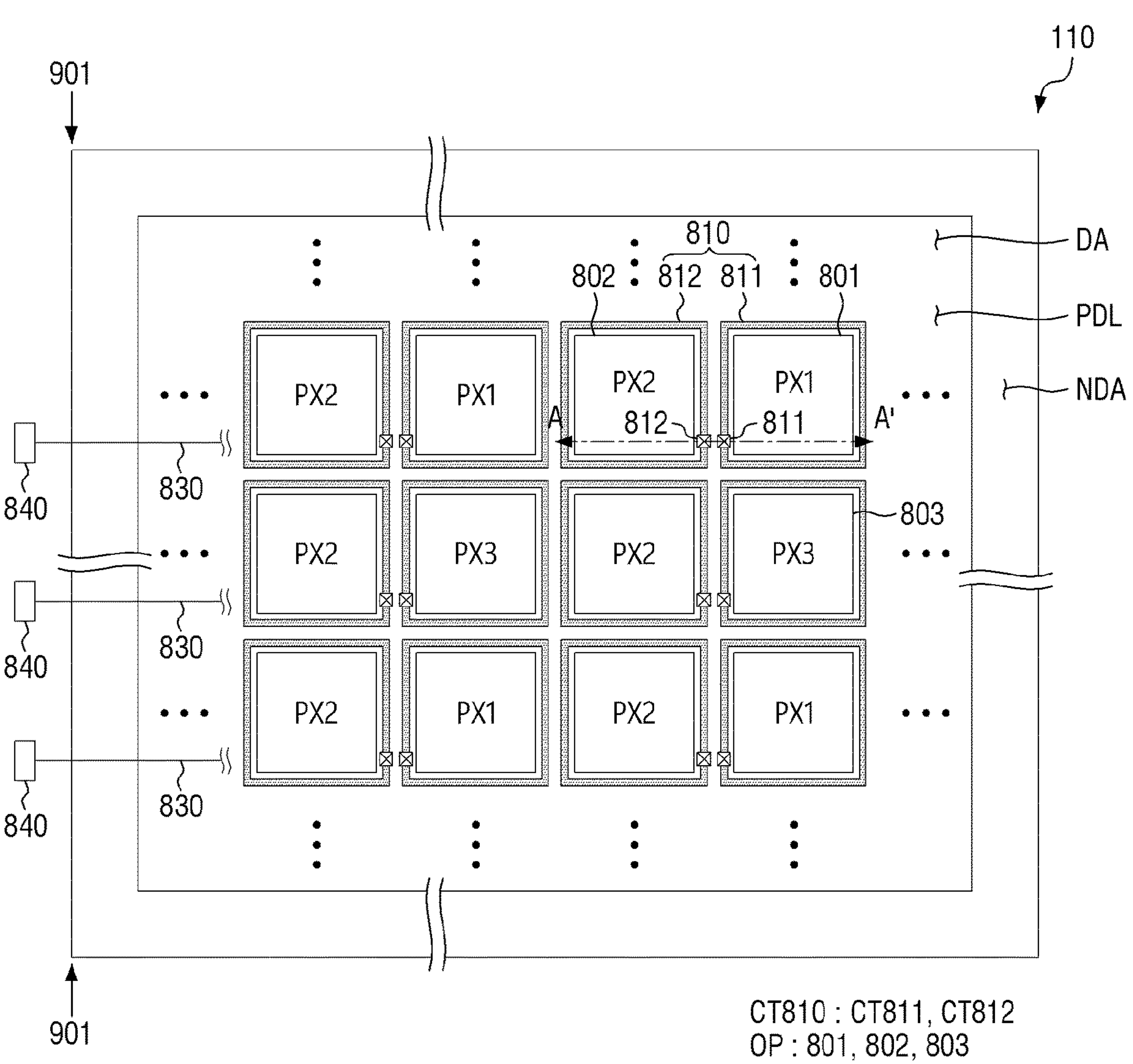
FIG. 9 illustrates an embodiment in which a heat driving pad unit illustrated in FIG. 8 is disposed on the outer edge of a cutting area.

FIG. 9 illustrates an embodiment in which a heat driving pad unit illustrated in FIG. 8 is disposed on the outer edge of a cutting area. Hereinafter, in the following description of the embodiment of FIG. 9, overlapping descriptions with those of the embodiment of FIG. 8 will be omitted, and description will focus on differences between the embodiment of FIG. 9 and the embodiment of FIG. 8.

The embodiment of FIG. 9 is different from the embodiment of FIG. 8 in that a display panel 110 does not include the power pad 840. The power pad 840 may be disposed outside the display panel 110, for example on a mother substrate (not illustrated) for manufacturing the display panels 110. The power pad 840 may not be included in the non-display area NDA of each display panel 110 after performing a cutting process to cut each of the display panels 110 from the mother substrate. Accordingly, the power pad 840 may not be disposed in the non-display area NDA of the display panel 110 manufactured as a single piece after the cutting process. In FIG. 9, arrows 901 indicate a cutting line for cutting each display panel 110 from the mother substrate including the display panels 110.

Figure 10:
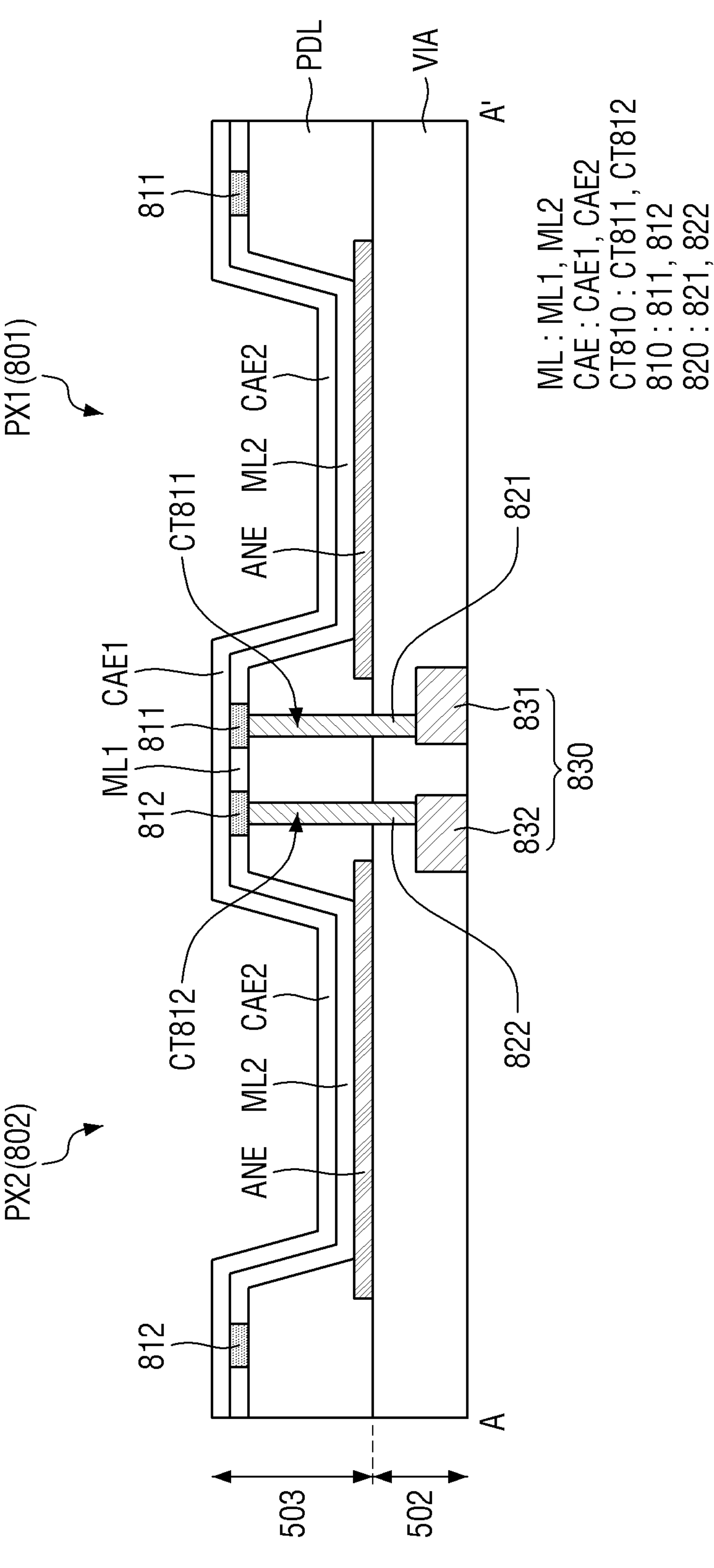
FIG. 10 is a cross-sectional view schematically illustrating the cross-sectional structure of adjacent pixels illustrated in FIGS. 8 and 9.
Figure 11:
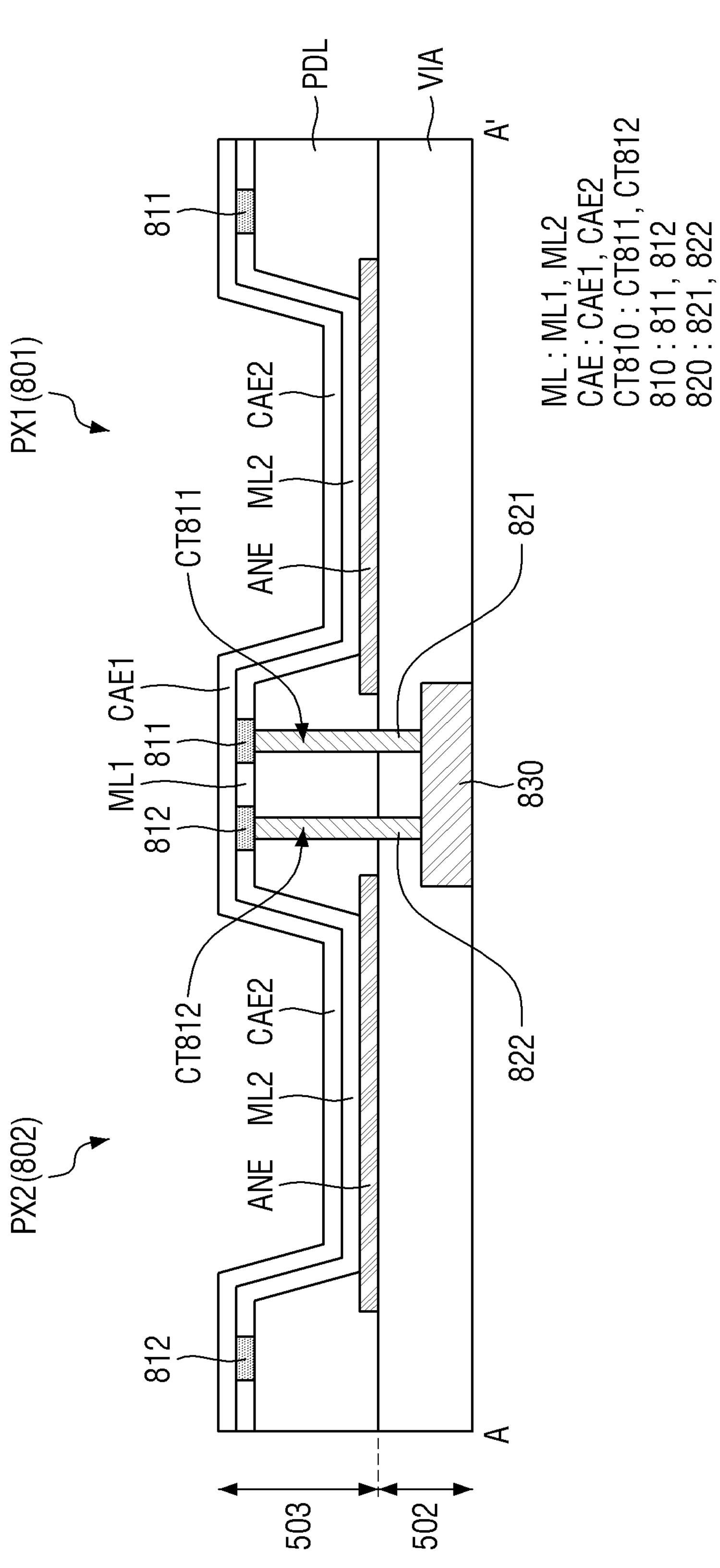
FIG. 11 illustrates an embodiment in which a first power supply wiring and second power supply wiring illustrated in FIG. 10 are merged into one wiring.

FIG. 10 is a cross-sectional view schematically illustrating the cross-sectional structure of adjacent pixels (e.g., PX1 and PX2) illustrated in FIGS. 8 and 9. FIG. 11 illustrates an embodiment in which a first power supply wiring 831 and a second power supply wiring 832 illustrated in FIG. 10 are merged into one wiring. For example, FIGS. 10 and 11 may be cross-sectional views of a light emitting element layer 503 of the display panel 110 taken along line A-A' of FIG. 8.

Referring to FIG. 10, the pixel defining layer PDL is disposed on a wiring layer to separate neighboring pixels (e.g., PX1 and PX2). In the illustrated example, the pixel defining layer PDL separates a first pixel PX1 and a second pixel PX2 neighboring each other. For example, a first electrode ANE of the first pixel PX1 is disposed in a first opening 801 of the pixel defining layer PDL, and a first electrode ANE of the second pixel PX2 is disposed in a second opening 802. The pixel defining layer PDL is disposed between the first opening 801 and the second opening 802.

An intermediate layer ML is disposed on the first electrodes ANE in the openings OP (801 and 802) of the first pixel PX1 and the second pixel PX2. The intermediate layer ML disposed on the first electrodes ANE in the openings OP (801 and 802) of neighboring pixels (e.g., PX1 and PX2) may extend onto an upper surface of the pixel defining layer PDL, but may be disconnected on and/or around the heating wirings 810 on the pixel defining layer PDL. That is, the intermediate layer ML covers the first electrodes ANE in the openings OP (801 and 802) of neighboring pixels (e.g., PX1 and PX2) and extends onto the upper surface of the pixel defining layer PDL, but may be disconnected on the pixel defining layer PDL between neighboring pixels (e.g., PX1 and PX2) by the heating wirings 810.

The disconnection of the intermediate layer ML described in this document may be interpreted as follows. The intermediate layer ML includes a plurality of layers as described with reference to FIGS. 6 and 7, and all of the layers may be disconnected on the heating wirings 810 (or around the heating wirings 810). However, the present disclosure is not limited thereto. For example, some conductive layers among the layers included in the intermediate layer ML may be disconnected on the heating wirings 810 (or around the heating wirings 810). In this case, some conductive layers may include at least one of a hole injection layer HIL, a hole transport layer HTL, an electron transport layer ETL, a charge generation layer CGL, and a P-doped layer PHIL.

A second electrode CAE is disposed on the intermediate layer ML in the openings OP (801 and 802) of the first pixel PX1 and the second pixel PX2. The second electrode CAE disposed on the intermediate layer ML in the openings OP (801 and 802) of the first pixel PX1 and the second pixel PX2 extends onto the pixel defining layer PDL to cover the intermediate layer ML and the heating wiring 810 exposed during a process by the removal of the intermediate layer ML. Therefore, the second electrode CAE is continuous while covering the intermediate layer ML in the openings OP of the pixel defining layer PDL and covering the intermediate layer ML and the heating wirings 810 between neighboring pixels (e.g., PX1 and PX2).

As described above, the second electrode CAE is shared among a plurality of pixels and continuously disposed between neighboring pixels (e.g., PX1 and PX2). In contrast, the intermediate layer ML is shared among a plurality of pixels but is disconnected between neighboring pixels (e.g., PX1 and PX2) by the heating wiring 810.

The continuous connection of the second electrode CAE and the disconnection of the intermediate layer ML will now be described in more detail.

According to an embodiment, a heating wiring 810 surrounding each of the openings OP (801 and 802) is disposed on the pixel defining layer PDL disposed between neighboring pixels (e.g., PX1 and PX2). A first portion ML1 of the intermediate layer ML and a second portion CAE1 of the second electrode CAE covering the first portion ML1 of the intermediate layer ML are disposed on the pixel defining layer PDL having the heating wiring 810. Here, the first portion ML1 of the intermediate layer ML is disconnected around the heating wiring 810 from a third portion ML2 of the intermediate layer ML disposed in the openings OP (801 and 802) of the pixel defining layer PDL. On the other hand, the second portion CAE1 of the second electrode CAE is continuously connected to a fourth portion CAE2 without being disconnected around the heating wiring 810 from the fourth portion CAE2 of the second electrode CAE disposed in the openings OP (801 and 802) of the pixel defining layer PDL. Here, the fourth portion CAE2 of the second electrode CAE disposed in the openings OP (801 and 802) is a portion that covers the third portion ML2 of the intermediate layer ML disposed in the openings OP (801 and 802).

Since the heating wiring 810 surrounds each of the openings OP (801 and 802) of the pixel defining layer PDL, a pair of heating wirings 811 and 812 may be disposed apart from each other on the pixel defining layer PDL disposed between neighboring pixels (e.g., PX1 and PX2). For example, a first heating wiring 811 surrounding the first opening 801 of the first pixel PX1 and a second heating wiring 812 surrounding the second opening 802 of the second pixel PX2 may be disposed on the pixel defining layer PDL disposed between neighboring pixels (e.g., PX1 and PX2). In addition, the first heating wiring 811 and the second heating wiring 812 may be spaced apart by a predetermined distance on the pixel defining layer PDL disposed between neighboring pixels (e.g., PX1 and PX2). Therefore, the intermediate layer ML on the pixel defining layer PDL which is disconnected from each pixel may be substantially disposed between the first heating wiring 811 and the second heating wiring 812. For example, the first portion ML1 of the intermediate layer ML which is disconnected from the third portion ML2 of the intermediate layer ML disposed in the openings OP (801 and 802) of the pixel defining layer PDL is disposed between the first heating wiring 811 and the second heating wiring 812.

According to an embodiment, the power wiring 830 may independently drive the first heating wiring 811 and the second heating wiring 812 surrounding neighboring pixels PX1 and PX2, respectively. The power wirings 830 and the heating wirings 810 may be provided on a one-to-one correspondence.

For example, the power supply wiring 830 may include a first power supply wiring 831 that drives the first heating wiring 811 and a second power supply wiring 832 that drives the second heating wiring 812. The first heating wiring 811 may be electrically connected to the first power supply wiring 831 through a first connection electrode 821 that fills the first contact hole CT811 penetrating the pixel defining layer PDL. The second heating wiring 812 may be electrically connected to the second power supply wiring 832 through a second connection electrode 822 that fills the second contact hole CT812 penetrating the pixel defining layer PDL. The first power supply wiring 831 and the second power supply wiring 832 may be arranged at intervals in the wiring layer 502 and may be driven independently. Although not illustrated, each of the first power supply wiring 831 and the second power supply wiring 832 may be disposed on different layers included in the wiring layer 502.

To disconnect the intermediate layer ML by applying the driving voltage (or driving current) to the heating wirings 810, the heating wirings 810 need to be heated to a high temperature of about 400° C. or higher. To this end, it is necessary to design the resistance of the heating wirings 810 to be relatively high. According to an embodiment, a first metal that forms the heating wirings 810, a second metal that forms the connection electrodes 820, and a third metal that forms the power supply wirings 830 may be different metals. Here, the resistance of the first metal may be greater than the resistance of the second metal, and the resistance of the second metal may be greater than the resistance of the third metal. That is, the resistance of the heating wirings 810 may be greater than the resistance of the connection electrodes 820, and the resistance of the connection electrodes 820 may be greater than the resistance of the power supply wirings 830.

Meanwhile, the embodiment of FIG. 11 is different from the embodiment of FIG. 10 in that a first power supply wiring 831 and a second power supply wiring 832 are merged into one power supply wiring 830. For example, a pair of heating wirings 810 surrounding each of the neighboring pixels (e.g., PX1 and PX2) may be electrically connected to one power supply wiring 830 through a contact hole CT810. The present disclosure may drive at least two heating wirings 810 disposed adjacent to each other as one group using one power supply wiring 830, thereby reducing the numbers of the power supply wiring 830 and the power pad 840. As illustrated in FIG. 11, one power supply wiring 830 drives (i.e., supplies the driving voltage to) two heating wirings 810 disposed adjacent to each other as one group. However, this is just one embodiment and one power supply wiring 830 may drive two or more heating wirings 810 disposed adjacent to each other as a group.

Figure 12:
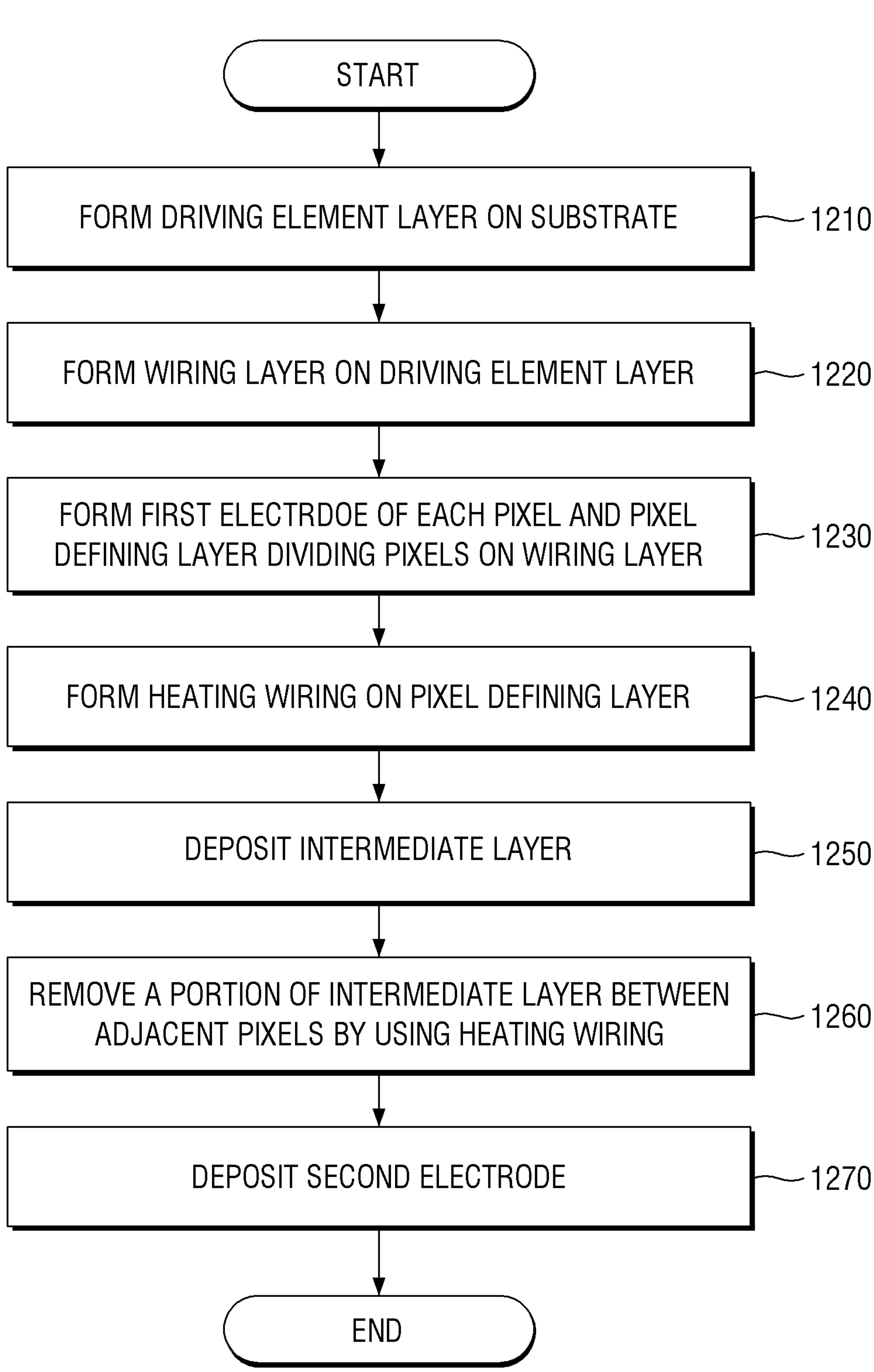
FIG. 12 is a flowchart illustrating a method of manufacturing the display panel illustrated in FIG. 10.

FIG. 12 is a flowchart illustrating a method of manufacturing the display panel 110 illustrated in FIG. 10. FIGS. 13 through 16 are cross-sectional views sequentially illustrating a method of manufacturing a display panel 110 according to an embodiment.

The method of manufacturing the display panel 110 according to the embodiment will now be described with reference to FIGS. 12 through 16. The following description focuses on the processes of manufacturing the display panel 110. Additional processes for forming the elements described herein may be performed before or after each operation described below. Also, conventional processes of manufacturing the display panel 110 may be additionally performed before or after each operation described below.

Referring to FIG. 12, in operation 1210, a driving element layer 501 may be formed on a substrate 200. The driving element layer 501 may include MOSFETs MOS described with reference to FIG. 5. The driving element layer 501 may include a display driving circuit 210 (see FIG. 2) and pixel driving circuits PC.

Figure 13:
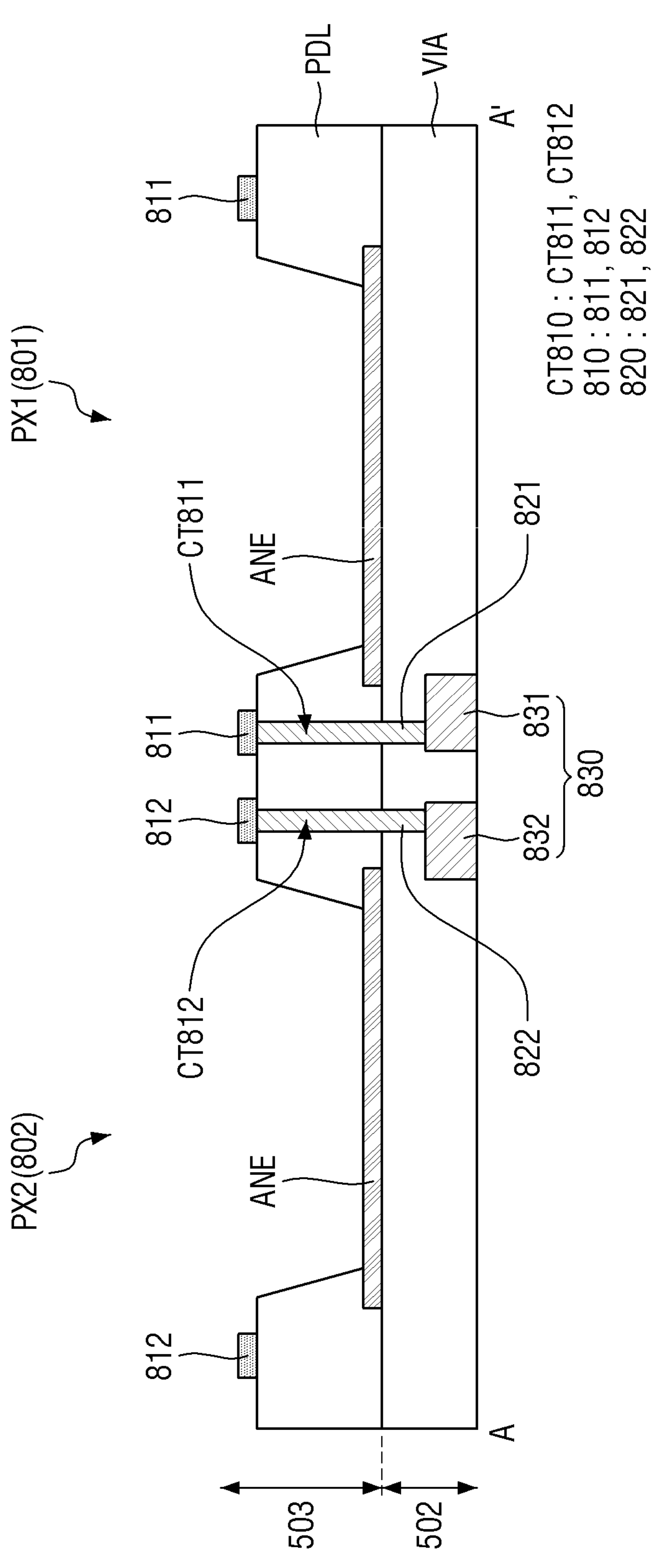
FIGS. 13 through 16 are cross-sectional views sequentially illustrating a method of manufacturing a display panel according to an embodiment.

Referring to FIGS. 12 and 13, in operation 1220, a wiring layer 502 may be formed on the driving element layer 501. The wiring layer 502 may include insulating layers VIA sequentially stacked on the driving element layer 501, connection electrodes CE at least partially extending through the insulating layers VIA, and a plurality of wirings. The wiring layer 502 may include a power supply wiring 830 for supplying a driving voltage (or driving current) to the heating wiring 810. The power supply wiring 830 may be, for example, a supply wiring for a low-potential voltage (second driving voltage ELVSS (see FIG. 4)).

Referring to FIGS. 12 and 13, in operation 1230, a first electrode ANE of each pixel and a pixel defining layer PDL defining the pixels may be formed on the wiring layer 502. The first electrode ANE of each pixel may be exposed during a process through an opening OP of the pixel defining layer PDL. Both ends of each first electrode ANE may be covered by the pixel defining layer PDL.

Referring to FIGS. 12 and 13, in operation 1240, contact holes CT810 extending through the pixel defining layer PDL and at least a portion of an insulating layer of the wiring layer 502 are formed, and connection electrodes 820 electrically connected to the power supply wirings 830 of the wiring layer 502 are formed by filling the contact holes CT810. Then, a heating wiring 810 may be formed on the pixel defining layer PDL to cover the connection electrodes 820 and surround each opening OP of the pixel defining layer PDL. Here, a first metal that forms the heating wiring 810, a second metal that forms the connection electrodes 820, and a third metal that forms the power supply wirings 830 may be different metals. Here, the resistance of the first metal may be greater than the resistance of the second metal, and the resistance of the second metal may be greater than the resistance of the third metal. That is, the resistance of the heating wirings 810 may be greater than the resistance of the connection electrodes 820, and the resistance of the connection electrodes 820 may be greater than the resistance of the power supply wirings 830.

Figure 14:
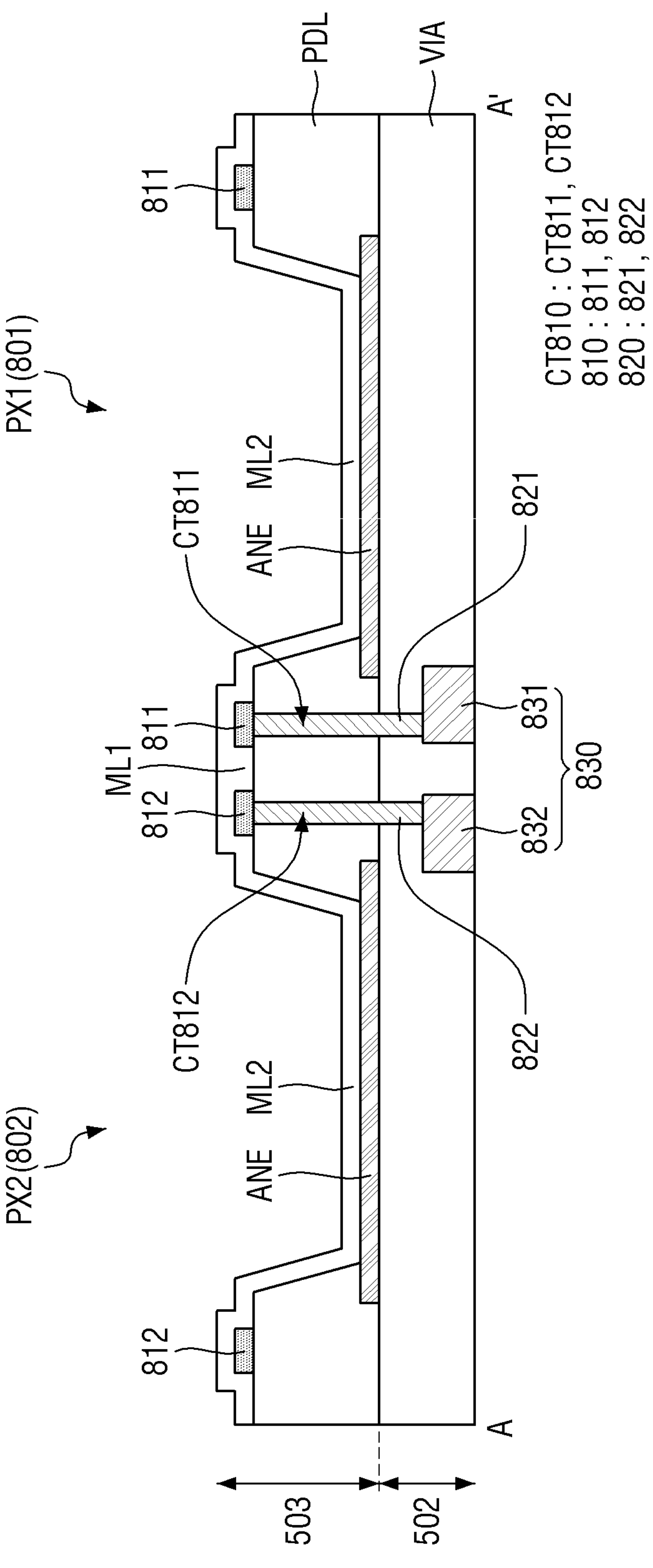

Referring to FIGS. 12 and 14, in operation 1250, an intermediate layer ML may be deposited. For example, the intermediate layer ML may be deposited not only in the openings OP of the pixel defining layer PDL but also on the pixel defining layer PDL between neighboring pixels (e.g., PX1 and PX2) by using an open mask (not illustrated). Accordingly, the intermediate layer ML may cover the first electrode ANE in each opening OP of the pixel defining layer PDL and cover the heating wirings 810 disposed on the pixel defining layer PDL.

Figure 15:
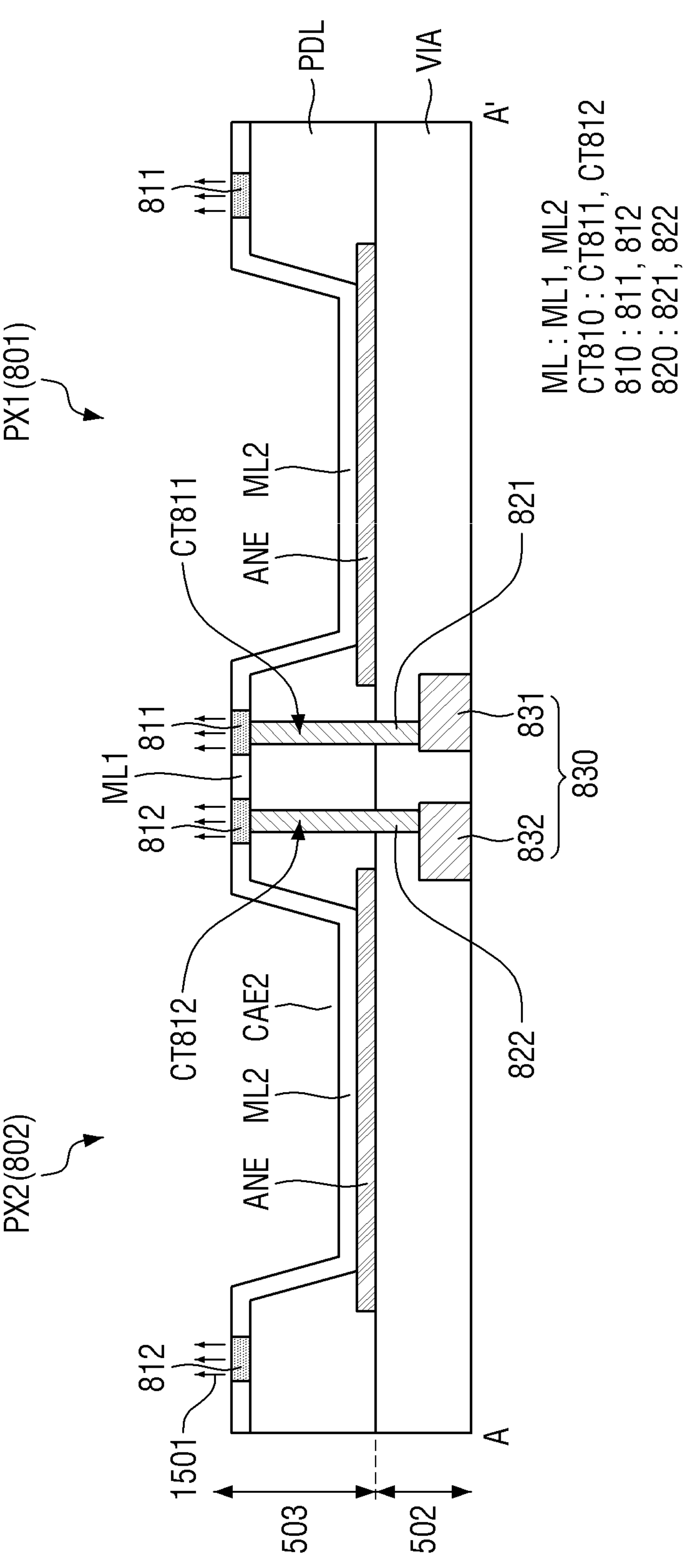

Referring to FIGS. 12 and 15, in operation 1260, all or at least a portion of the intermediate layer ML disposed between neighboring pixels (e.g., PX1 and PX2) may be removed using the heating wirings 810. To this end, a driving voltage (or driving current) may be applied to the power pad 840 and the driving voltage (or driving current) applied to the to the power pad 840 may be supplied to each heating wiring 810 passing through the power supply wiring 830 and the connection electrode 820. The heating wirings 810 are heated to a high temperature of about 400° C. or higher by the driving voltage (or driving current). All or at least a portion of the intermediate layer ML deposited on the heating wirings 810 may be removed due to the high temperature of the heating wirings 810.

Figure 16:
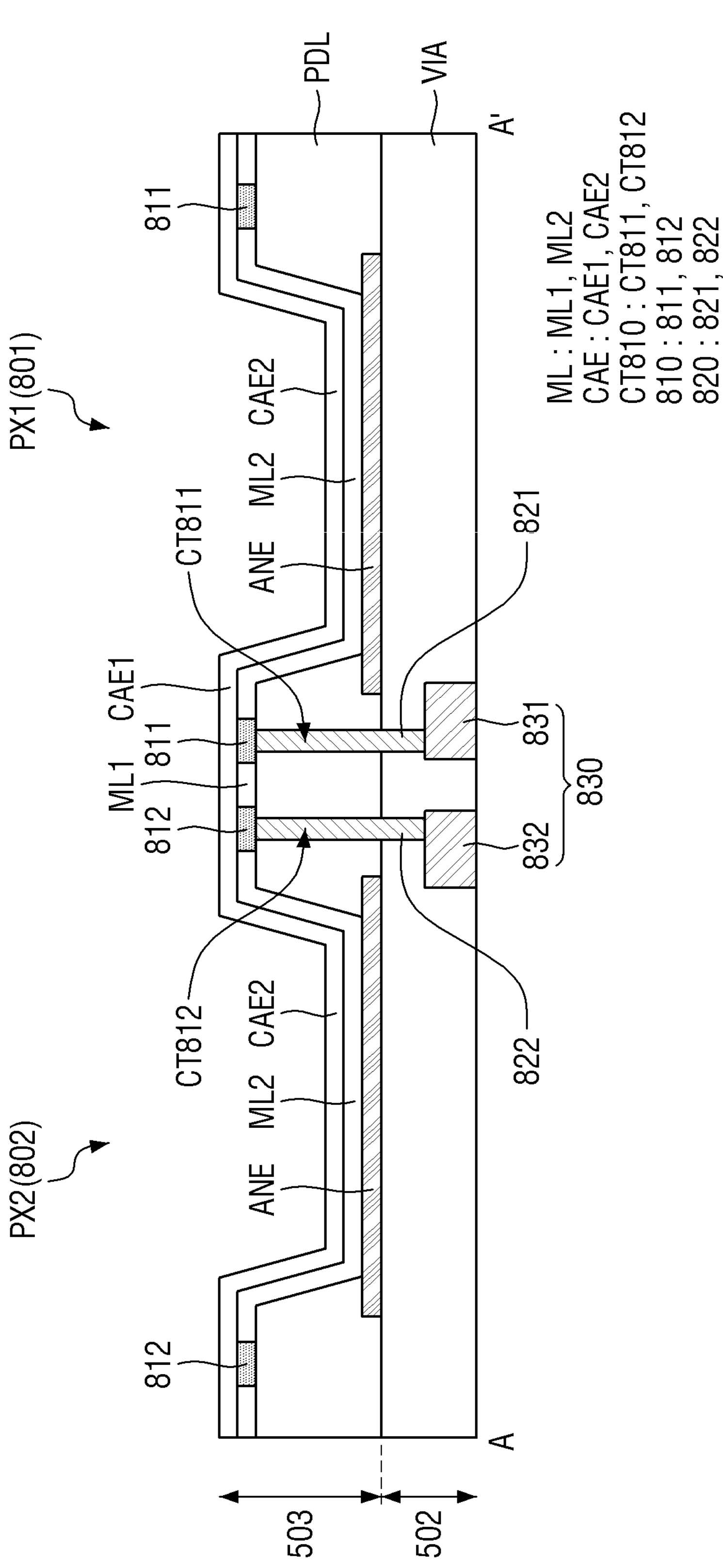

Referring to FIGS. 12 and 16, in operation 1270, a second electrode CAE may be deposited. For example, the second electrode CAE may be deposited not only in the openings OP of the pixel defining layer PDL but also on the pixel defining layer PDL disposed between neighboring pixels (e.g., PX1 and PX2) by using an open mask. Accordingly, the second electrode CAE may cover the intermediate layer ML in each opening OP of the pixel defining layer PDL and cover the intermediate layer ML and the heating wirings 810 disposed on the pixel defining layer PDL.

In the method of manufacturing the display panel 110 described with reference to FIGS. 12 through 16, the process of removing all or part of the intermediate layer ML using the heating wirings 810 is performed before the operation of depositing the second electrode CAE. However, the present disclosure is not limited thereto. For example, the process of removing all or part of the intermediate layer ML using the heating wirings 810 may also be performed after the operation of depositing the second electrode CAE.

A method of performing the process of removing all or part of the intermediate layer ML using the heating wirings 810 after the operation of depositing the second electrode CAE and a display panel 110 manufactured using the method will now be described with reference to FIGS. 17 through 22.

Figure 17:
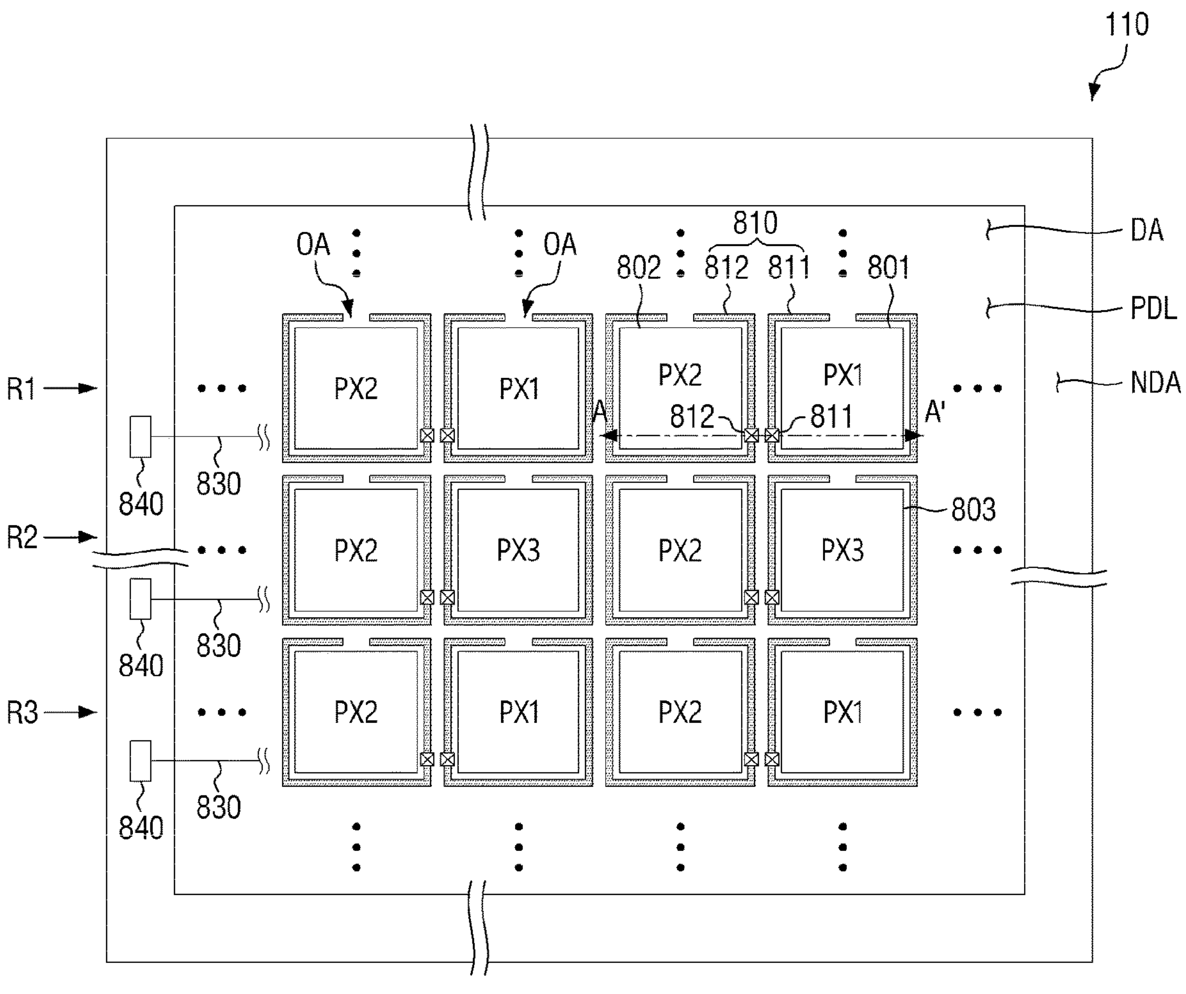
FIG. 17 illustrates an embodiment in which a heating wiring illustrated in FIG. 8 includes an open slit area in a specific lateral direction of each pixel.

FIG. 17 illustrates an embodiment in which a heating wiring 810 illustrated in FIG. 10 includes an open slit area OA in a specific lateral direction of each pixel. In the following description of the embodiment of FIG. 17, overlapping descriptions with those of the embodiment of FIG. 10 will be omitted, and descriptions will focus on the differences between the embodiment of FIG. 17 and the embodiment of FIG. 10.

The embodiment of FIG. 17 is different from the embodiment of FIG. 10 in that a heating wiring 810 includes an open slit area OA without completely surrounding each opening OP of a pixel defining layer PDL. For example, when viewed in a normal direction perpendicular to an upper surface of a substrate 200, the heating wiring 810 may surround each opening OP of the pixel defining layer PDL, but may include the open slit area OA open in a specific lateral direction. In the illustrated example, the open slit area OA is located in a first lateral direction (e.g., an upper side in FIG. 17) of each pixel, but the present disclosure is not limited thereto.

According to an embodiment, the open slit area OA may be defined as an area in which the heating wiring 810 is not disposed. Since the heating wiring 810 is not disposed in the open slit area OA, an intermediate layer ML and a second electrode CAE of a light emitting element may be continuous in the open slit area OA without being disconnected. For example, the intermediate layer ML located outside each heating wiring 810 may be electrically connected to the intermediate layer ML located inside each heating wiring 810 (e.g., each opening OP of the pixel defining layer PDL) through the open slit area OA. Similarly, the second electrode CAE located outside each heating wiring 810 may be electrically connected to the second electrode CAE located inside each heating wiring 810 (e.g., each opening OP of the pixel defining layer PDL) through the open slit area OA. Therefore, the intermediate layer ML and the second electrode CAE may be continuous in the open slit area OA without being disconnected.

Figure 18:
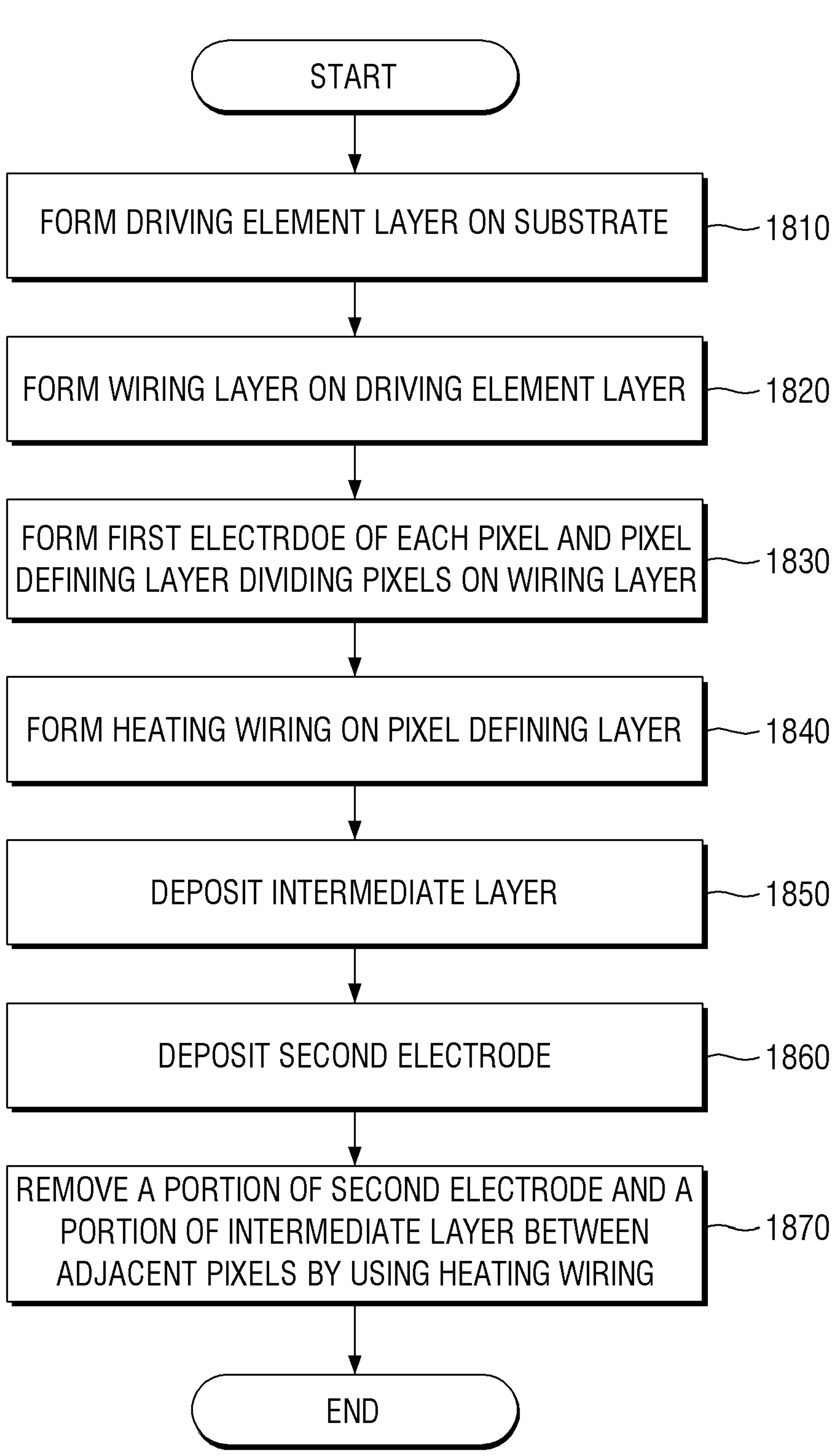
FIG. 18 is a flowchart illustrating a method of manufacturing the display panel illustrated in FIG. 17.

FIG. 18 is a flowchart illustrating a method of manufacturing the display panel 110 illustrated in FIG. 17. FIGS. 19 through 22 are cross-sectional views sequentially illustrating a method of manufacturing a display panel 110 according to an embodiment.

The method of manufacturing the display panel 110 according to the embodiment will now be described with reference to FIGS. 18 through 22. The following description focuses on the processes of manufacturing the display panel 110. Additional processes for forming the elements described in this document may be performed before or after each operation described below. In addition, conventional processes of manufacturing the display panel 110 may be additionally performed before or after each operation described below.

Referring to FIG. 18, in operation 1810, a driving element layer 501 may be formed on a substrate 200. The driving element layer 501 may include MOSFETs MOS described with reference to FIG. 5. The driving element layer 501 may include a display driving circuit 210 (see FIG. 2) and pixel driving circuits PC. Operation 1810 is substantially the same as operation 1210 described with reference to FIG. 12.

Figure 19:
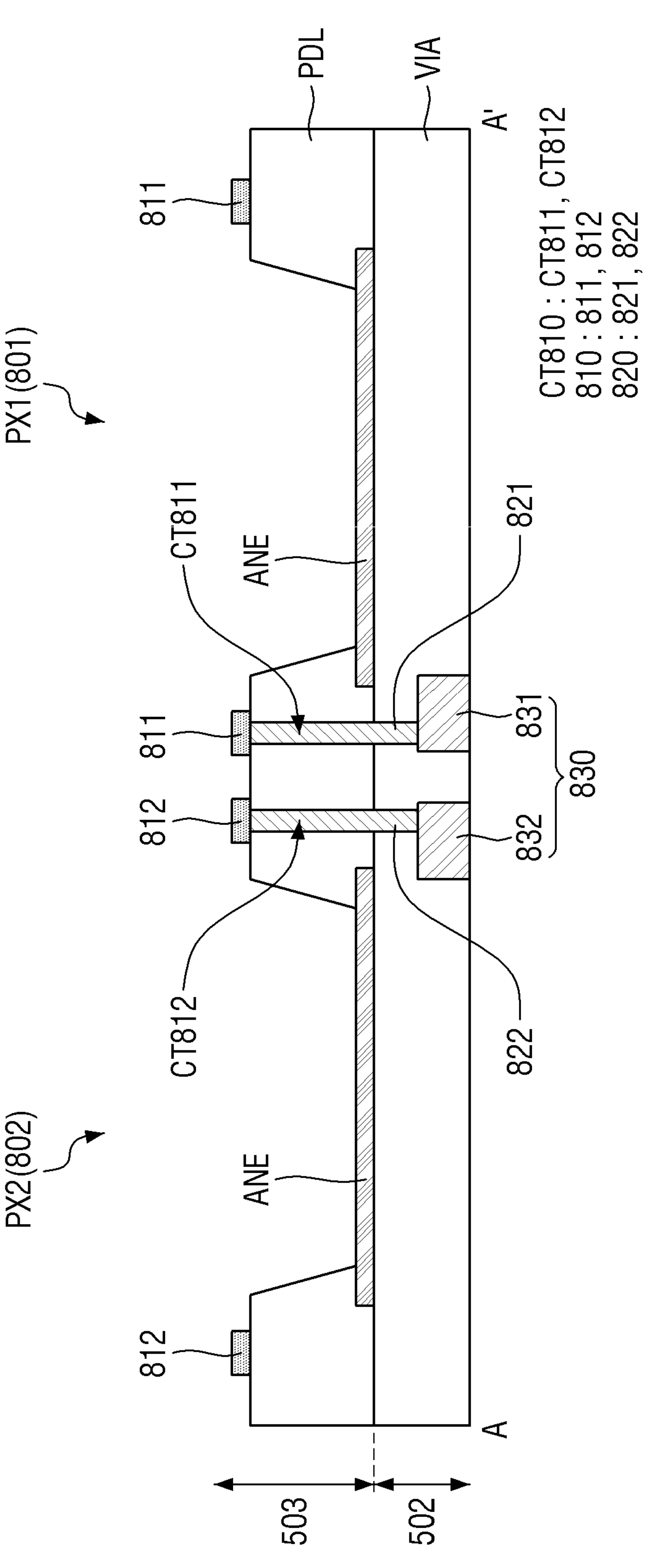
FIGS. 19 through 22 are cross-sectional views sequentially illustrating a method of manufacturing a display panel according to an embodiment.

Referring to FIGS. 18 and 19, in operation 1820, a wiring layer 502 may be formed on the driving element layer 501. The wiring layer 502 may include insulating layers VIA sequentially stacked on the driving element layer 501, connection electrodes CE at least partially penetrating the insulating layers VIA, and a plurality of wirings. The wiring layer 502 may include a power supply wiring 830 for supplying a driving voltage (or driving current) to the heating wiring 810. The power supply wiring 830 may be, for example, a supply wiring for a low-potential voltage (second driving voltage ELVSS (see FIG. 4)). Operation 1820 is substantially the same as operation 1220 described with reference to FIG. 12.

Referring to FIGS. 18 and 19, in operation 1830, a first electrode ANE of each pixel and a pixel defining layer PDL defining the pixels may be formed on the wiring layer 502. The first electrode ANE of each pixel may be exposed during a process through an opening OP of the pixel defining layer PDL. Both ends of each first electrode ANE may be covered by the pixel defining layer PDL. Operation 1830 is substantially the same as operation 1230 described with reference to FIG. 12.

Referring to FIGS. 18 and 19, in operation 1840, contact holes CT810 extending through the pixel defining layer PDL and at least a portion of an insulating layer of the wiring layer 502 are formed, and connection electrodes 820 electrically connected to the power supply wirings 830 of the wiring layer 502 are formed by filling the contact holes CT810. Then, a heating wiring 810 may be formed on the pixel defining layer PDL to cover the connection electrodes 820 and surround each opening OP of the pixel defining layer PDL. Here, a first metal that forms the heating wiring 810, a second metal that forms the connection electrodes 820, and a third metal that forms the power supply wirings 830 may be different metals. Here, the resistance of the first metal may be greater than the resistance of the second metal, and the resistance of the second metal may be greater than the resistance of the third metal. That is, the resistance of the heating wirings 810 may be greater than the resistance of the connection electrodes 820, and the resistance of the connection electrodes 820 may be greater than the resistance of the power supply wirings 830. In operation 1840, the heating wiring 810 is formed to have an open slit area OA without completely surrounding each opening OP of the pixel defining layer PDL.

Figure 20:
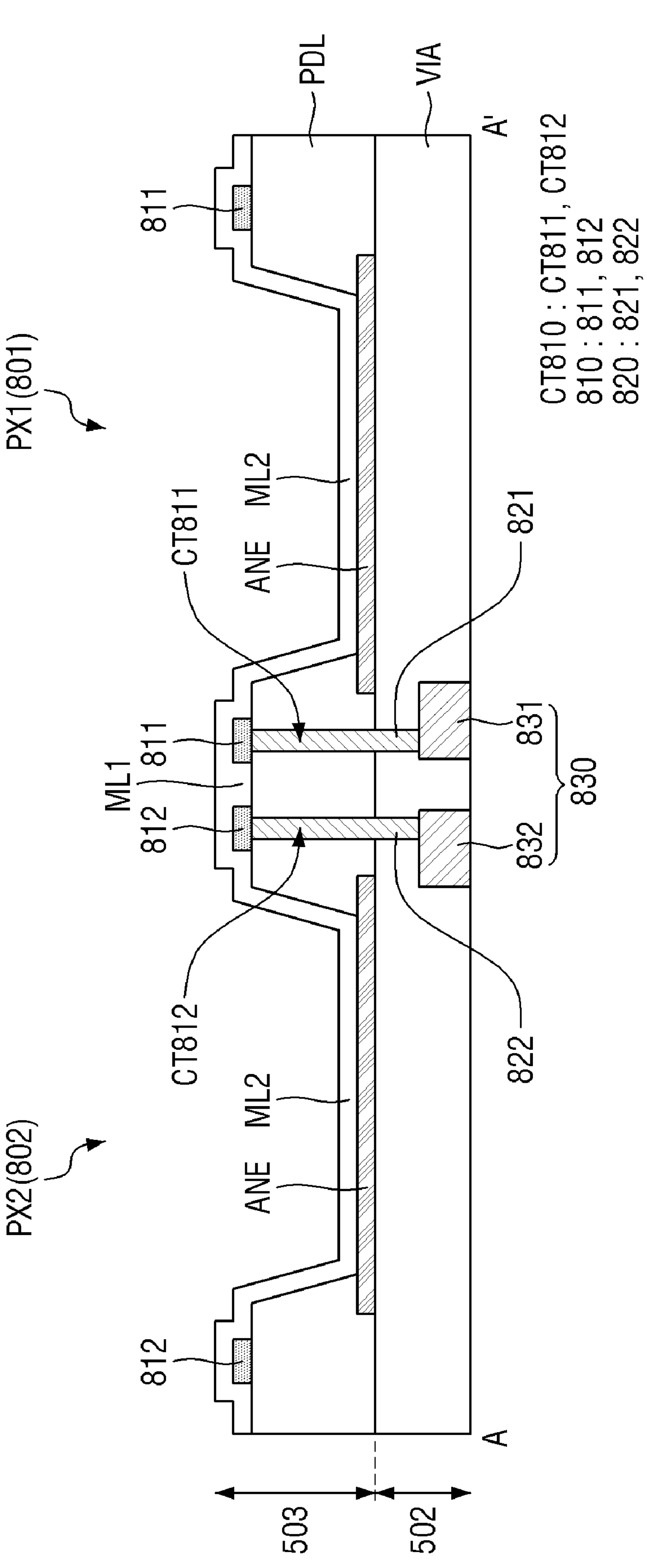

Referring to FIGS. 18 and 20, in operation 1850, an intermediate layer ML may be deposited. For example, the intermediate layer ML may be deposited not only in the openings OP of the pixel defining layer PDL but also on the pixel defining layer PDL between neighboring pixels (e.g., PX1 and PX2) by using an open mask (not illustrated). Accordingly, the intermediate layer ML may cover the first electrode ANE in each opening OP of the pixel defining layer PDL and cover the heating wirings 810 disposed on the pixel defining layer PDL. Operation 1850 is substantially the same as operation 1250 described with reference to FIG. 12.

Figure 21:
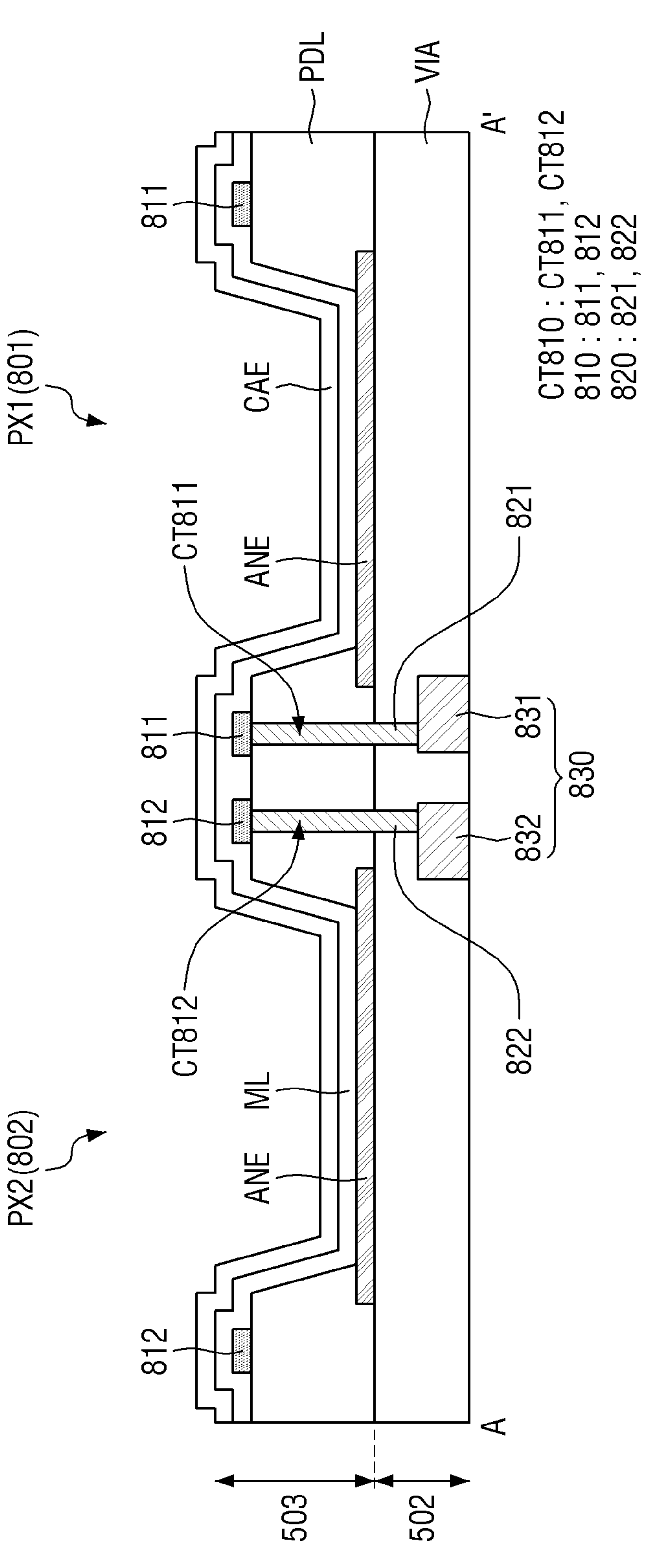

Referring to FIGS. 18 and 21, in operation 1860, a second electrode CAE may be deposited. For example, the second electrode CAE may be deposited not only in the openings OP of the pixel defining layer PDL but also on the pixel defining layer PDL disposed between neighboring pixels (e.g., PX1 and PX2) by using an open mask (not illustrated). Accordingly, the second electrode CAE may cover the intermediate layer ML in each opening OP of the pixel defining layer PDL and cover the intermediate layer ML disposed on the pixel defining layer PDL.

Figure 22:
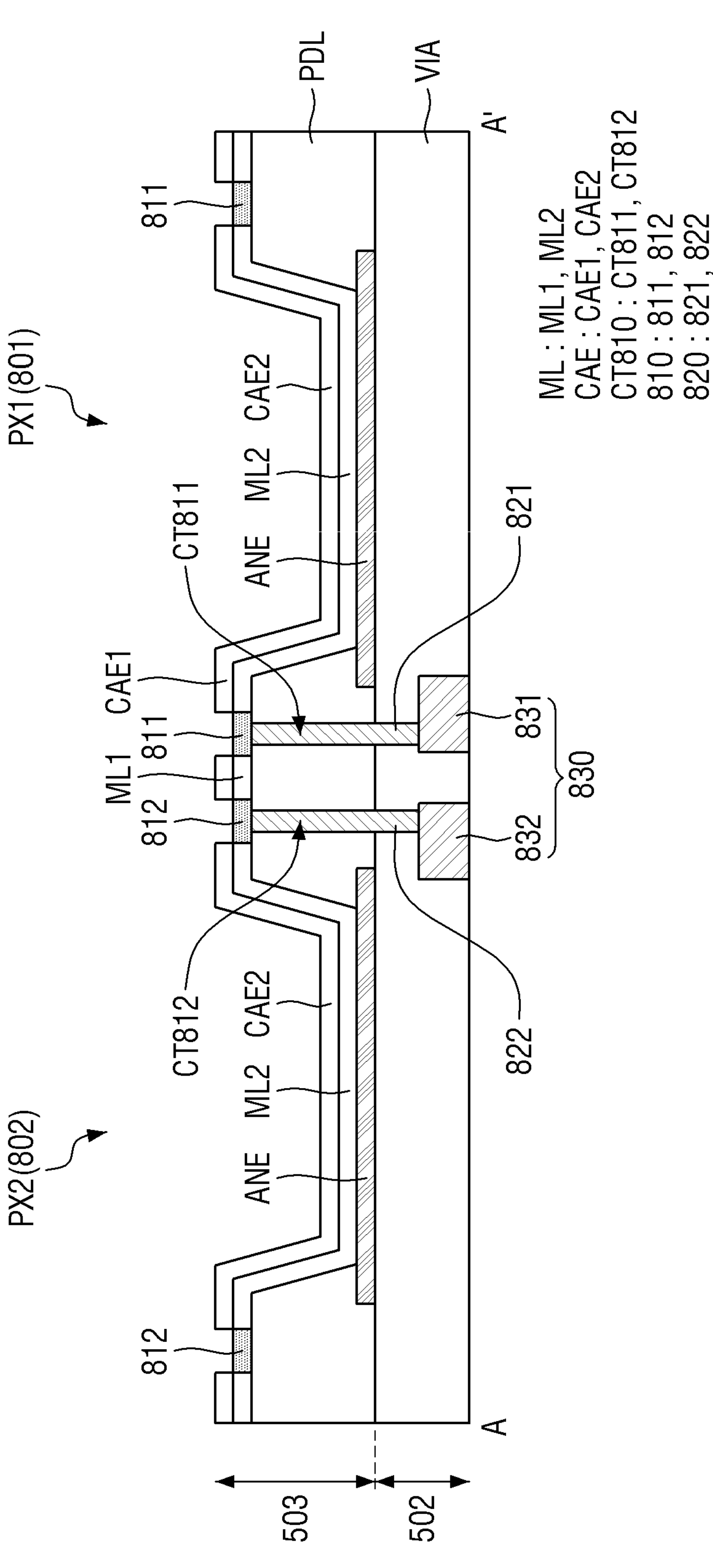

Referring to FIGS. 18 and 22, in operation 1870, all or at least a portion of the intermediate layer ML and the second electrode CAE disposed between neighboring pixels (e.g., PX1 and PX2) may be removed using the heating wirings 810. To this end, a driving voltage (or driving current) may be applied to the power pad 840 and the driving voltage (or driving current) applied to the to the power pad 840 may be supplied to each heating wiring 810 passing through the power supply wiring 830 and the connection electrode 820. The heating wirings 810 are heated to a high temperature of about 400° C. or higher by the received driving voltage (or driving current). At least a portion of the intermediate layer ML deposited on the heating wirings 810 and a portion of the second electrode CAE deposited thereon may be removed due to the high temperature of the heating wirings 810. However, since the heating wirings 810 do not completely surround each opening OP and provide an open slit area OA, the intermediate layer ML and the second electrode CAE may be continuous in the open slit area OA without being disconnected.

Figure 23:
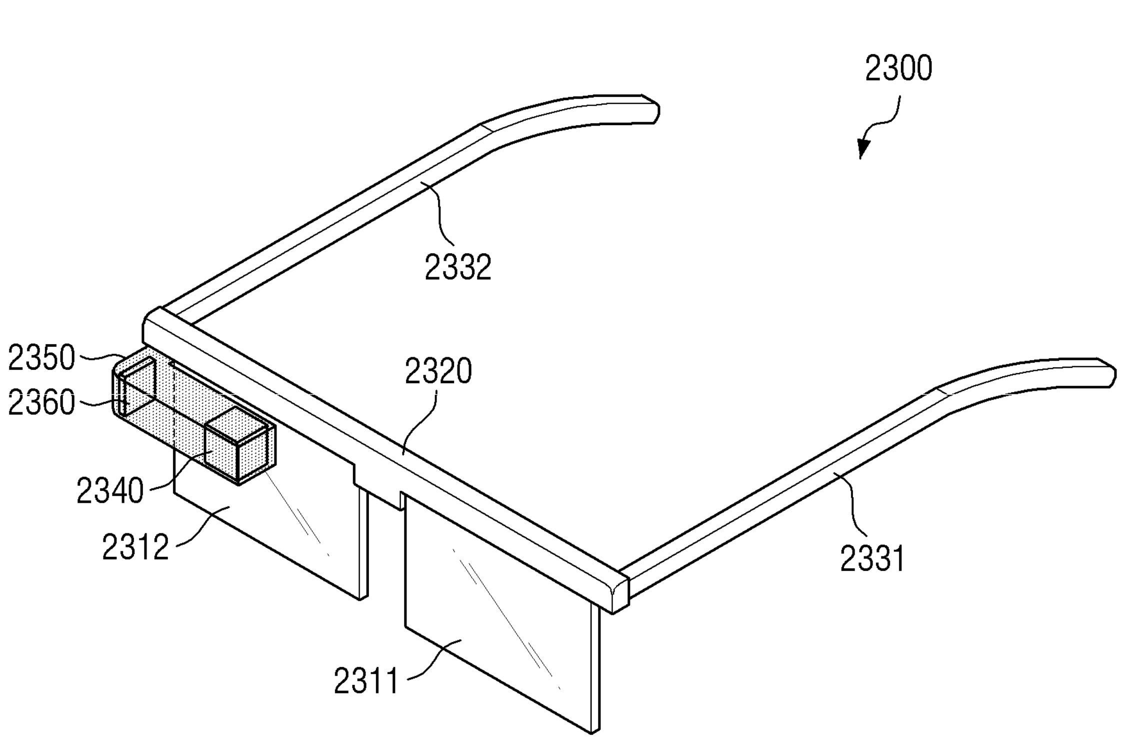
FIG. 23 is an example view of a wearable device including a display device according to an embodiment.

FIG. 23 is an example view of a wearable device including a display device according to an embodiment.

A display device 10 according to an embodiment may be a display device 10 included in a mobile electronic device. The display device 10 according to the embodiment may be included in a wearable device that is developed in the form of glasses or a helmet and forms a focus at a short distance from a user's eyes. For example, the wearable device may be a head mounted display (HMD) or augmented reality (AR) glasses. Such a wearable device provides an AR screen or a virtual reality (VR) screen to a user.

FIG. 23 illustrates a VR device 2300 to which a display device 2360 according to an embodiment has been applied. Here, the display device 2360 may be, for example, a display device 2360 including the elements of FIGS. 1 through 22 described above.

Referring to FIG. 23, the VR device 2300 according to an embodiment may be an AR device in the form of glasses. The VR device 2300 according to the embodiment may include the display device 2360, a left lens 2311, a right lens 2312, a support frame 2320, eyeglass frame legs 2331 and 2332, a reflective member 2340, and an image processing unit 2350.

The image processing unit 2350 may include the display device 2360 and the reflective member 2340. An image displayed on the display device 2360 may be reflected by the reflective member 2340 and provided to a user's right eye through the right lens 2312. Accordingly, the user may view a VR image displayed on the display device 2360 through the right eye.

Although the image processing unit 2350 is disposed at a right end of the support frame 2320 in FIG. 23, the present disclosure is not limited thereto. For example, the image processing unit 2350 may also be disposed at a left end of the support frame 2320. In this case, an image displayed on the display device 2360 may be reflected by the reflective member 2340 and provided to the user's left eye through the left lens 2311. Accordingly, the user may view a VR image displayed on the display device 2360 through the left eye. Alternatively, image generation unit 2350 may be disposed at both the right end and the left end of the support frame 2320. In this case, the user may view a VR image displayed on the display device 2360 through both the left eye and the right eye.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense and not for purposes of limitation.

What is claimed is:

1. A display device comprising:
- a substrate;
- a driving element layer disposed on the substrate;
- a wiring layer disposed on the driving element layer and including a power supply wiring; and
- a light emitting element layer disposed on the wiring layer,
- wherein the light emitting element layer comprises:
  - a pixel defining layer defining openings for pixels;
  - a first electrode disposed in each opening of the openings;
  - a heating wiring disposed on the pixel defining layer around each opening;
  - a connection electrode connecting the heating wiring to the power supply wiring through a contact hole extending through at least a portion of the wiring layer and the pixel defining layer;

an intermediate layer covering the first electrode in each of the pixels and the pixel defining layer between the pixels, and including a disconnected portion on the pixel defining layer adjacent to the heating wiring; and a second electrode continuously disposed on the intermediate layer in the openings for the pixels and between the pixels.

2. The display device of claim 1, wherein the disconnected portion of the intermediate layer and the second electrode covering the disconnected portion of the intermediate layer are disposed on the pixel defining layer between the pixels, wherein the disconnected portion of the intermediate layer is disconnected from a pixel portion of the intermediate layer disposed in the openings of the pixel defining layer, and wherein the second electrode is continuously disposed on the disconnected portion and the pixel portion of the intermediate layer.

3. The display device of claim 2, wherein the pixels include a first pixel and a second pixel, and the openings include a first opening of the first pixel and a second opening of the second pixel, wherein a first heating wiring around the first opening and a second heating wiring around the second opening are spaced apart at a predetermined interval on the pixel defining layer between the pixels.

4. The display device of claim 3, wherein the disconnected portion of the intermediate layer is disposed between the first heating wiring and the second heating wiring.

5. The display device of claim 3, wherein the power supply wiring including a first power supply wiring driving the first heating wiring and a second power supply wiring driving the second heating wiring, wherein the first heating wiring is electrically connected to the first power supply wiring through a first connection electrode extending through the pixel defining layer, and wherein the second heating wiring is electrically connected to the second power supply wiring through a second connection electrode extending through the pixel defining layer.

6. The display device of claim 5, wherein the first power supply wiring and the second power supply wiring are spaced apart at the predetermined interval on the wiring layer and are driven independently.

7. The display device of claim 5, wherein, the first power supply wiring and the second power supply wiring are connected into one wiring on the wiring layer, and a pair of heating wirings surrounding each of the neighboring pixels is electrically connected to one power supply wiring.

8. The display device of claim 1, wherein a first metal forming the heating wiring, a second metal forming the connection electrode, and a third metal forming the power supply wiring comprise different metals.

9. The display device of claim 1, wherein the resistance of the first metal is greater than the resistance of the second metal, and the resistance of the second metal is greater than the resistance of the third metal.

10. The display device of claim 1, wherein the intermediate layer comprises one or more conductive layers having a disconnected portion adjacent to the heating wiring, and wherein the conductive layers include at least one of a hole injection layer HIL, a hole transport layer HTL, an electron transport layer ETL, a charge generation layer CGL, and a P-doped layer PHIL.

11. The display device of claim 1, wherein the heating wiring disposed around each opening includes an open slit area open in a predefined lateral direction.

12. The display device of claim 11, wherein the intermediate layer and the second electrode are continuously disposed around the open slit area.

13. A mobile electronic device comprising a display panel, wherein the display panel comprises:

a substrate;

a driving element layer disposed on the substrate;

a wiring layer disposed on the driving element layer and including a power supply wiring; and a light emitting element layer disposed on the wiring layer, wherein the light emitting element layer comprises:

a pixel defining layer defining openings for pixels;

a first electrode disposed in each opening of the openings;

a heating wiring disposed on the pixel defining layer around each opening of the pixel defining layer;

a connection electrode connecting the heating wiring and the power supply wiring through a contact hole extending through at least a portion of the wiring layer and the pixel defining layer;

an intermediate layer covering the first electrode in each of the pixels and the pixel defining layer between the pixels, and including a disconnected portion on the pixel defining layer adjacent to the heating wiring; and a second electrode continuously disposed on the intermediate layer in each of the openings for the pixels and between the pixels.

14. The mobile electronic device of claim 13, wherein the disconnected portion of the intermediate layer and the second electrode covering the disconnected portion of the intermediate layer are disposed on the pixel defining layer between the pixels, wherein the disconnected portion of the intermediate layer is disconnected from a pixel portion of the intermediate layer disposed in the openings of the pixel defining layer, and wherein the second electrode is continuously disposed on the disconnected portion and the pixel portion of the intermediate layer.

15. The mobile electronic device of claim 14, wherein the openings include a first opening of a first pixel and a second opening of a second pixel, wherein a first heating wiring around the first opening and a second heating wiring around the second opening are spaced apart at a predetermined interval on the pixel defining layer between pixels.

16. The mobile electronic device of claim 15, wherein the disconnected portion of the intermediate layer is disposed between the first heating wiring and the second heating wiring.

17. The mobile electronic device of claim 15, wherein the power supply wiring including a first power supply wiring driving the first heating wiring and a second power supply wiring driving the second first heating wiring, wherein the first heating wiring is electrically connected to the first power supply wiring through a first connection electrode extending through the pixel defining layer, and wherein the second heating wiring is electrically connected to the second power supply wiring through a second connection electrode extending through the pixel defining layer.

18. The mobile electronic device of claim 17, wherein the first power supply wiring and the second power supply wiring are spaced apart at the predetermined interval on the wiring layer and are driven independently.

19. The mobile electronic device of claim 17, wherein, the first power supply wiring and the second power supply wiring are connected into one wiring on the wiring layer, and a pair of heating wirings surrounding each of the neighboring pixels is electrically connected to one power supply wiring.

20. The mobile electronic device of claim 13, wherein a first metal forming the heating wiring, a second metal forming the connection electrode, and a third metal forming the power supply wiring are different metals, and the resistance of the first metal is greater than the resistance of the second metal, and the resistance of the third metal is greater than the resistance of the third metal.

* * * * *